United States Patent [19]
Baz

[11] Patent Number: 5,485,053
[45] Date of Patent: Jan. 16, 1996

[54] METHOD AND DEVICE FOR ACTIVE CONSTRAINED LAYER DAMPING FOR VIBRATION AND SOUND CONTROL

[76] Inventor: Amr M. Baz, 7811 Epsilon Dr., Rockville, Md. 20855

[21] Appl. No.: 136,210

[22] Filed: Oct. 15, 1993

[51] Int. Cl.⁶ .................................................. H01L 41/08
[52] U.S. Cl. ............................................. 310/326; 181/208
[58] Field of Search ................................ 181/207, 208, 181/209, 290, 294, 295, 296; 381/71; 310/326, 316, 317, 800

[56] References Cited

U.S. PATENT DOCUMENTS 4,626,730  12/1986  Hubbard, Jr. ........................... 310/326

OTHER PUBLICATIONS

Baz et al.; Performance of an active control system with Piezoelectric Actuators; vol. 126, No. 2; 1988; pp. 327–343.
Baz et al; Optimum Vibration Control of Flexible Beams By Piezo–Electric Actuators; Proceedings of the Sixth VPI&SU/AIAA Symposium Held in Blacksbury, Va.; Jun. 29–Jul. 1, 1987; pp. 217–234.
Cremer et al; Structure–Borne Sound Structural Vibrations and Sound Radiation at Audio Frequencies; Springer–Verlag Berlin Heidelberg New York; 1973 and 1988; pp. 242–265.
Nashif et al; Vibration Damping; A Wiley–Interscience Publication–John Wiley & Sons; 1985; pp. 258–323.
Asnani et al; Virbation Damping Characteristics of Multilayered Beams With Constrained Viscoelastic Layers; Journal of Engineering for Industry; Aug. 1976; pp. 895–901.

*Primary Examiner*—Khanh Dang
*Attorney, Agent, or Firm*—Cushman Darby & Cushman

[57] ABSTRACT

A new method and device for actively-controlled constrained layer (ACLD) treatment which can be used as an effective means for damping out vibrations and sounds from flexible structures are described. The ACLD treatment consists of a visco-elastic damping layer which is sandwiched between two piezo-electric layers. The three-layer composite ACLD, when bonded to a surface which is subject to vibrational and/or sound disturbances, acts as a smart constraining layer damping treatment with built-in sensing and actuation capabilities. The sensing capability is provided by the piezo-electric layer bonded to the surface of the flexible structure, whereas the actuation or control capability is generated by the other piezo-electric layer which acts as an active constraining layer.

7 Claims, 33 Drawing Sheets

METHOD AND DEVICE FOR ACTIVE CONSTRAINED LAYER DAMPING FOR VIBRATION AND SOUND CONTROL

BACKGROUND OF THE INVENTION

1. Field of the Invention

The present invention relates to a method and device for damping out vibrations and sounds from flexible stuctures by treating the structure with an actively-controlled constrained layer.

2. Description of the Related Art

Passive surface treatments have been extensively utilized, as a simple and reliable means, for damping out the vibration and sound of a wide variety of flexible structures (Cremer, Heckl and Ungar 1988). Such surface treatments rely in their operation on the use of visco-elastic damping layers which are bonded to the vibrating structures either in an unconstrained or constrained configuration as shown in FIGS. 1 and 2, respectively.

Under cyclic loading, constrained damping layers experience shear strains which are much larger than those encountered in unconstrained damping layers (Nashif, A., D. Jones and J. Henderson 1985). Accordingly, the constrained damping layers are capable of dissipating higher vibrational energies and, in turn, achieving higher damping ratios than their counter-parts: the unconstrained damping layers. Higher damping ratios can also be attained, over a broad range of temperatures and frequencies, through the use of multilayer damping (Asnani and Nakra 1976). Higher damping ratios are obtained, however, at the expense of adding considerable weight to the vibrating base structures. This poses serious limitation to their use for many applications where the weight is of critical importance.

It is therefore an object of this invention to introduce a new class of actively-controlled constrained layer damping (ACLD) treatment which can have high energy dissipation-to-weight characteristics as compared to conventional constrained or unconstrained damping layer configurations.

SUMMARY OF THE INVENTION

This application discloses a new class of actively-controlled constrained layer (ACLD) treatment which can be used as an effective means for damping out vibrations and sounds from flexible structures. The ACLD consists of a visco-elastic damping layer which is sandwiched between two piezo-electric layers. The three-layer composite ACLD, when bonded or attached to a surface which is subject to vibrational and/or sound disturbances, acts as a smart constraining layer damping treatment with built-in sensing and actuation capabilities. A smart is defined as any method or device having both sensing and control capabilities.

The sensing capability of the ACLD is provided by the piezo-electric layer directly bonded to the surface which is subject to vibrational and/or sound disturbances, whereas the actuation or control capability is generated by the other piezo-electric layer which acts as an active constraining layer. In this manner, the smart ACLD consists of a conventional passive constrained layer damping treatment which is augmented with efficient active control means to control the strain of the constrained layer in response to the structural vibrations or sounds. With appropriate activation of the strain control, the shear deformation of the visco-elastic damping layer can be increased, the energy dissipation mechanism can be enhanced and the vibrations and/or sounds can be damped out.

The ACLD relies in its operation on an optimized blend between the attributes of both the active and passive damping controls. In other words, the simplicity and reliability of passive damping are combined with the low weight and high efficiency of active damping controls to achieve high damping characteristics over broad frequency bands. Such characteristics are essential to the optimal damping of vibration and/or sound.

This disclosure aims primarily at describing the fundamental principles that govern the operation of this new class of smart ACLD treatment, indicating its excellent merits as compared to conventional damping layers and emphasizing its commercial potential.

DETAILED DESCRIPTION

Figure 1:
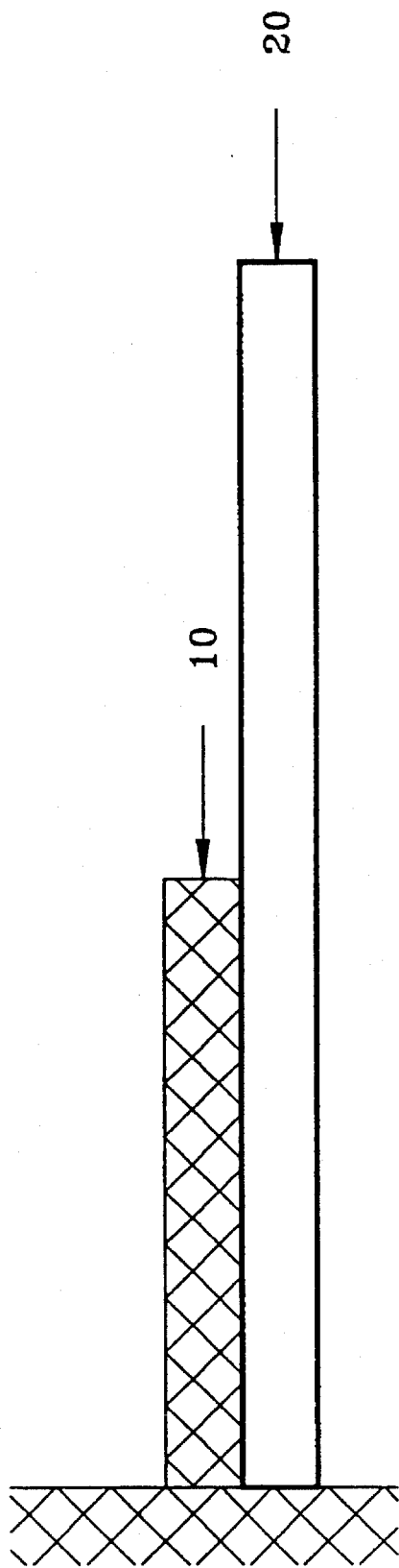
FIG. 1 is a schematic representation of a conventional passive unconstrained layer damping device. The damping action is generated by the longitudinal deflection of the unconstrained damping layer (10) relative to the flexible structure (20). Such damping action is relatively small.
Figure 2:
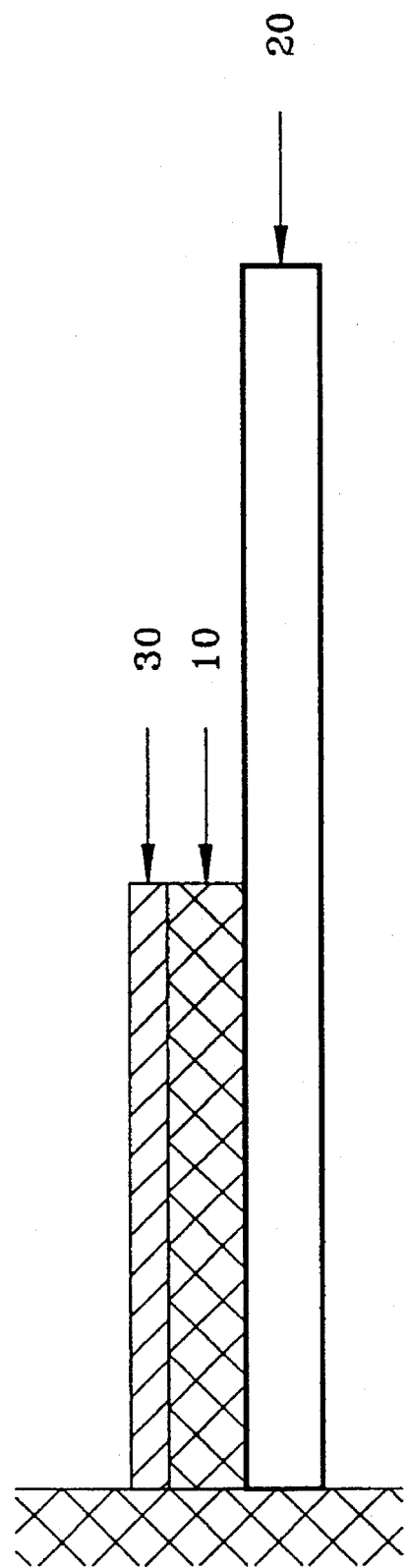
FIG. 2 is a schematic representation of a conventional passive constrained layer damping device. The damping action is generated by the shear deformation of the constrained damping layer (30) relative to the flexible structure or beam (20). Such damping action is greater than that of the unconstrained damping layer.
Figure 3:
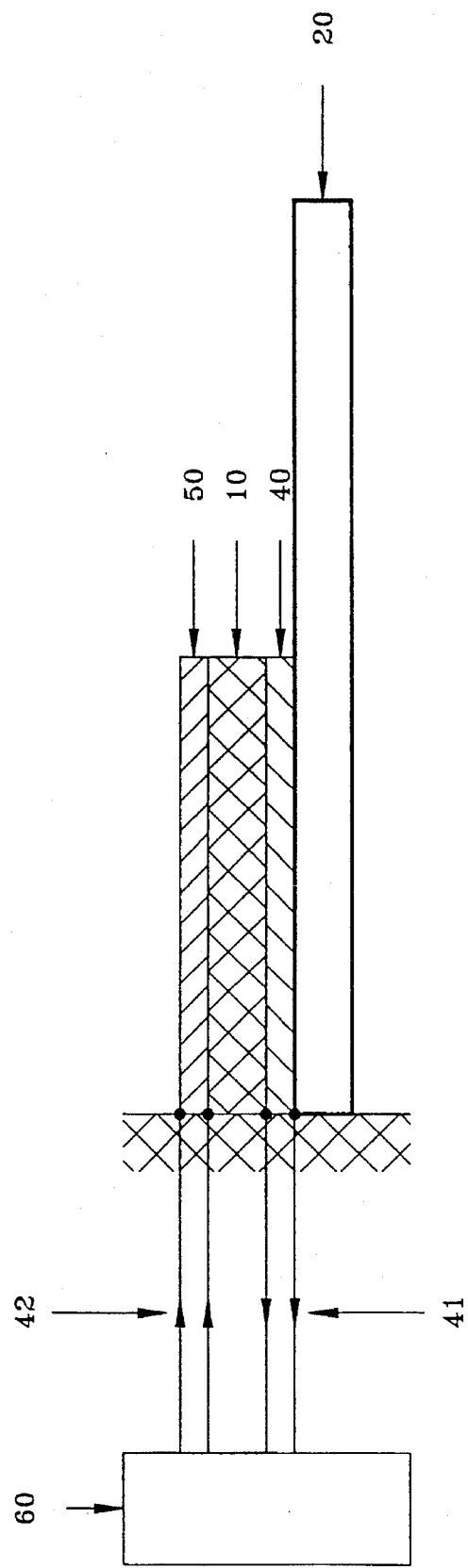
FIG. 3 is a schematic representation of the active constrained layer damping device (ACLD) of the present invention. The ACLD damping action is enhanced by actively increasing the shear deformation of the constrained damping layer (50) in response to the vibration or sound from the flexible structure or beam (20). Such damping action is greater than those of the conventional constrained and unconstrained damping layers. The piezo-sensor (40) detects the structural vibration and/or sound and the resulting signal (41) is amplified (60) and the control signal (42) sent to the piezo-constraining layer (50) to control its longitudinal deflection in such a way that suppresses the structural vibrations and/or sounds.

The actively-controlled constrained layer damping (ACLD) device or treatment consists of a conventional passive constrained layer damping device which is augmented with efficient active control means to control the strain of the constrained layer in response to the structural vibrations, as shown in FIG. 3. The visco-elastic damping layer (10) is sandwiched between two piezo-electric layers (40, 50). The three-layer composite ACLD when bonded or attached to a surface (20) subject to vibration acts as a smart constraining layer damping treatment with built-in sensing and actuation capabilities. A smart is defined as any method or device having both sensing and control capabilities.

The sensing capability, as indicated by the sensor voltage $V_s$ (41), is provided by the piezo-electric layer (40) which is directly bonded to the vibrating surface (20). The actuation or control capability is generated by the other piezo-electric layer (50) which acts as an active constraining layer activated by the control voltage $V_c$, (42). With appropriate strain control, through proper manipulation of $V_s$, the shear deformation of the visco-elastic damping layer (10) can be increased, the energy dissipation mechanism can be enhanced and the vibration can be damped out.

In this manner, the ACLD provides a viable means for damping out the vibration as it combines an optimal blend of passive and active control capabilities with low weight characteristics. This makes the ACLD particularly suitable for critical applications where damping-to-weight ratio is important as in helicopters.

Figure 4:
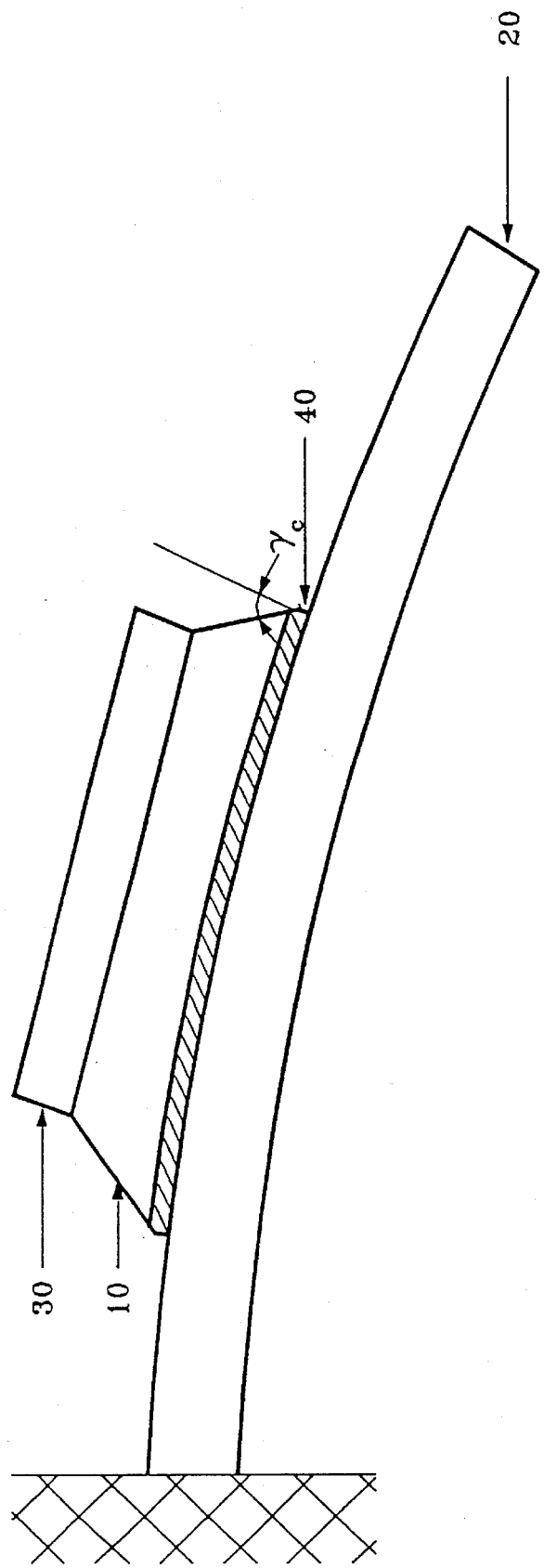
FIG. 4 is a schematic representation of the operating principle of conventional constrained layer damping when the beam (20) is moving downward. The interface between the visco-elastic layer (10) and the structure (20) expands whereas its interface with the conventional constraining layer (30) is constrained from moving. This relative motion between the two interfaces generates a shear deformation in the visco-elastic layer equal to $\gamma_c$.
Figure 5:
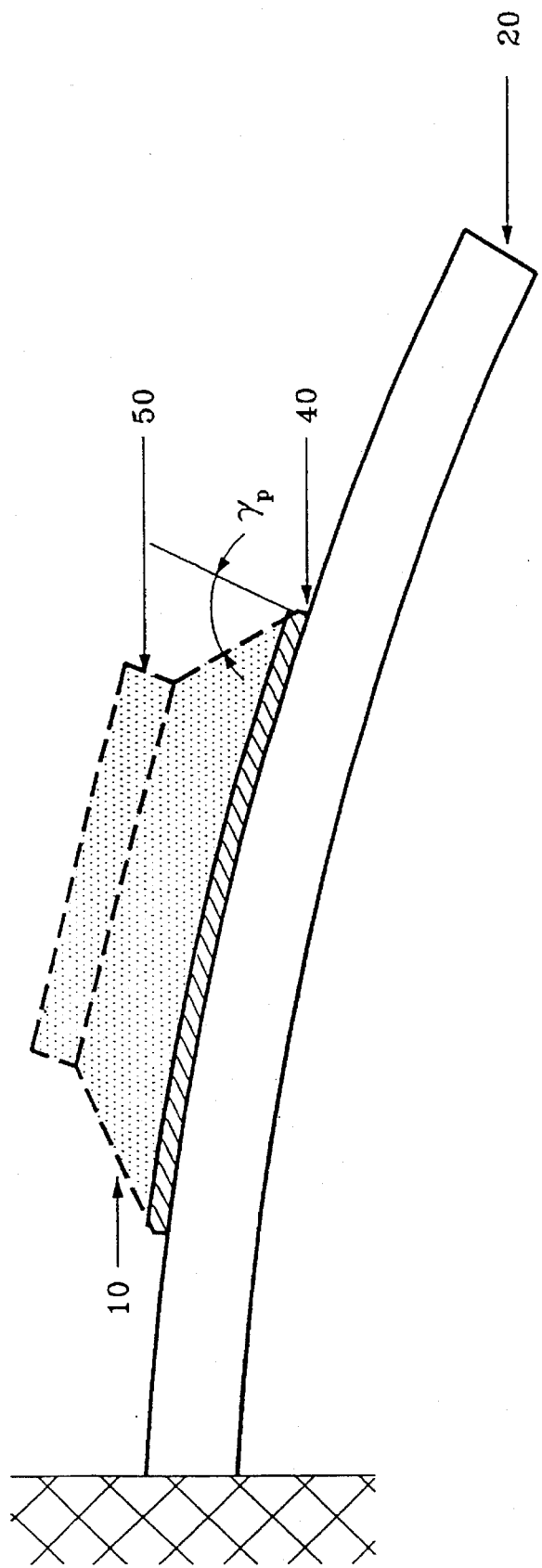
FIG. 5 is a schematic representation of the operating principle of active constrained layer damping when the beam (20) is moving downward. The interface between the visco-elastic layer (1O) and the structure (20) expands whereas its interface with the active constraining layer (50) is no longer constrained from moving but it is controlled to contract in order to increase the shear deformation in the visco-elastic layer (10). Such control action is generated by feeding back the signal of the piezo-sensor (40) to the piezo-constraining layer (50). The resulting relative motion between the two interfaces increases the shear deformation in the visco-elastic layer to $\gamma_p$.
Figure 7:
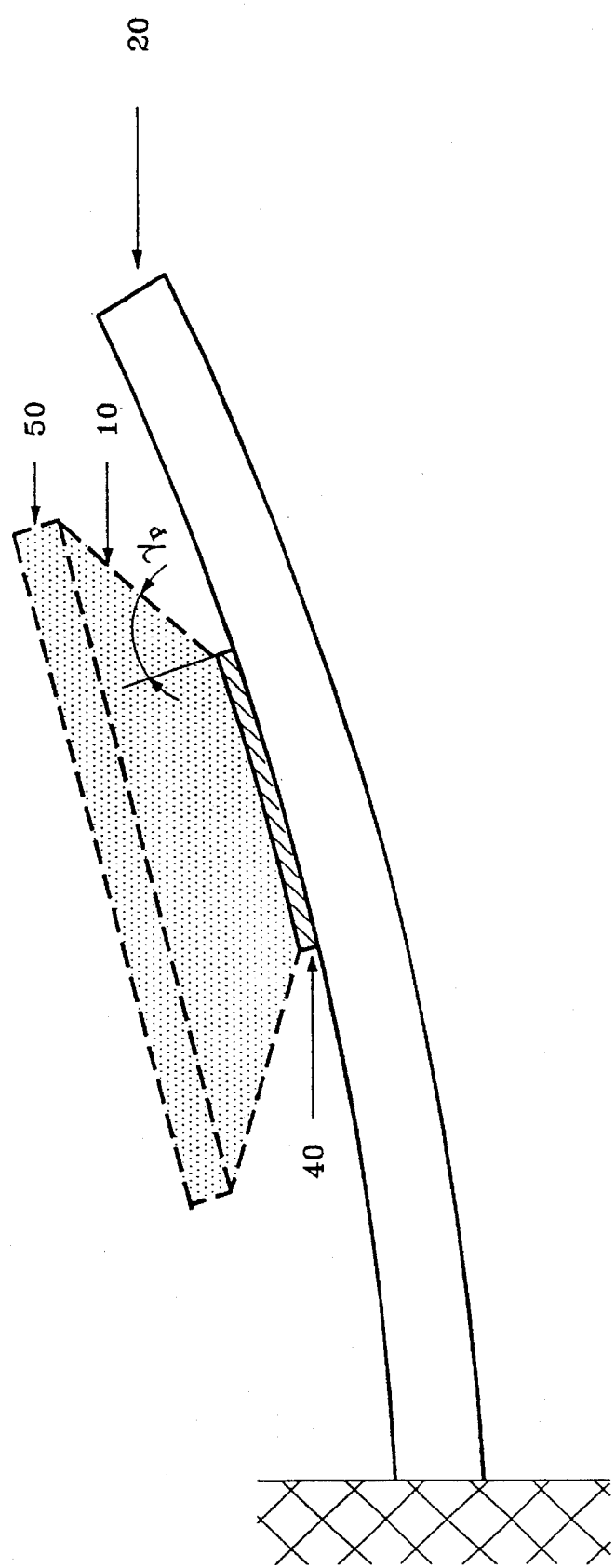
FIG. 7 is a schematic representation of the operating principle of active constrained layer damping when the beam (20) is moving upward. The interface between the visco-elastic layer (10) and the beam (20) contracts whereas its interface with the active constraining layer (50) is no longer constrained from moving but is controlled to expand in order to increase the shear deformation in the visco-elastic layer (10). Such control action is generated by feeding back the signal from the piezo-sensor (40) to the piezo-constraining layer (50). The resulting relative motion between the two interfaces increases the shear deformation in the visco-elastic layer (10) to $\gamma_p$.

More specifically, the ACLD consists of a visco-elastic damping layer which is placed in between two piezo-electric layers as shown in FIGS. 5 and 7. The three-layer composite ACLD is bonded to a beam (20) subject to vibrations to act as a smart constraining layer damping treatment with built-in sensing and actuation capabilities. The sensing is provided by the piezo-electric layer (40) directly bonded to the vibrating surface (20) whereas the actuation is generated by the other piezo-electric layer (50) which acts as an active constraining layer. The effect of interaction between the sensor and the actuator on the operation of the ACLD can best be understood by considering the motion experienced by the beam during a typical vibration cycle. In FIG. 4, as the beam moves downward away from its horizontal equilibrium position, the sensor (40) which is bonded to the outer fibers of the beam (20) will be subjected to tensile stresses generating accordingly a positive voltage $V_s$ by the direct piezo-electric effect. If the sensor voltage is amplified, its polarity is reversed and the resulting voltage $V_c$ is fed back to activate the piezo-electric constraining layer (50); the constraining layer will shrink by the virtue of the reversed piezo-electric effect. The shrinkage of the active constraining layer (50) results in a shear deformation angle $\gamma_p$, shown in FIG. 5, in the visco-elastic layer (10), which is larger than the angle $\gamma_c$ developed by a conventional passive constraining layer (30), as indicated in FIG. 4.

Figure 6:
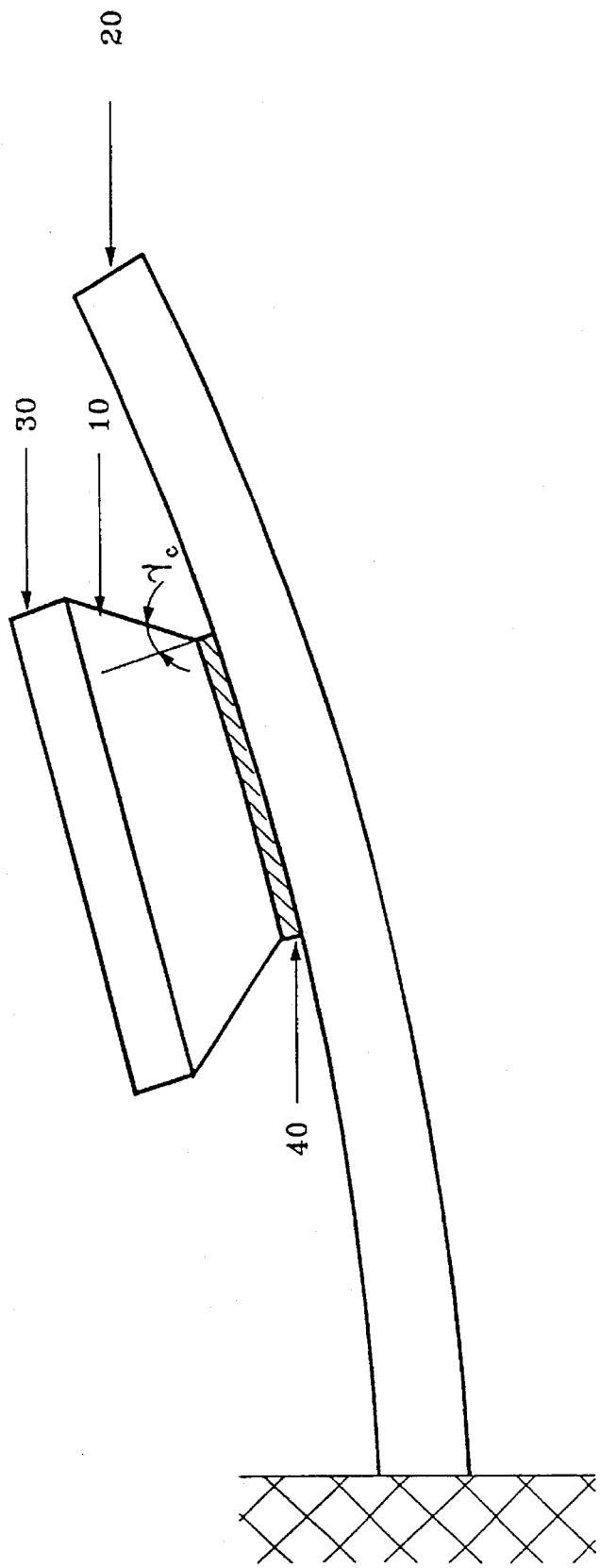
FIG. 6 is a schematic representation of the operating principle of conventional constrained layer damping when the beam (20) is moving upward. The interface between the visco-elastic layer (1O) and the structure (20) contracts whereas its interface with the conventional constraining layer (30) is constrained from moving. This relative motion between the two interfaces generates a shear deformation in the visco-elastic layer (10) equal to $\gamma_c$.

Similarly, FIGS. 6 and 7 demonstrate the operation of the ACLD during the upward motion of the beam. During this part of the vibration cycle, the top fibers of the beam (20) as well as the active constraining piezo-electric sensor (40) experience compressive stresses and a negative voltage is generated by the sensor. Direct feedback of the sensor signal to the active constraining layer (50) makes the active constaining layer extend thereby increasing the shear deformation angle to $\gamma_p$, as shown in FIG. 7, as compared to $\gamma_c$ for the conventional constraining layer (30), as shown in FIG. 6.

The increase of the shear deformation of the visco-elastic layer, during the entire vibration cycle, is accompanied with an increase in the energy dissipated. Furthermore, the shrinkage (or expansion) of the active constraining piezo-electric layer during the upward motion (or during the downward motion) produces a bending moment on the beam which tends to bring the beam back to its equilibrium position. Therefore, the dual effect of the enhanced energy dissipation and the additional restoring bending moment will quickly damp out the vibration of the flexible beam. This dual effect, which does not exist in conventional constrained damping layers, significantly contributes to the damping effectiveness of the smart ACLD. In this manner, the smart ACLD consists of a conventional passive constrained layer damping which is augmented with the described dual effect to actively control the strain of the constrained layer, in response to the structural vibrations. With appropriate strain control strategy, the shear deformation of the visco-elastic damping layer can be increased, the energy dissipation mechanism can be enhanced and the vibration can be damped out. One possible strategy is the direct feedback of the sensor voltage to power the active constraining layer. Other strategies will rely on feeding back both the sensor voltage and its derivative to obtain proportional and derivative control action. With such a strategy additional damping can be imparted to the vibrating beam system and the versatility of active controls can be utilized to considerably improve the damping characteristics of the ACLD.

Therefore, the ACLD relies in its operation on a blend between the attractive attributes of both the active and passive controls. In other words, the simplicity and reliability of passive damping are combined with the low weight and high efficiency of active controls to achieve high damping characteristics over broad frequency bands. Such characteristics are essential to the optimal damping of vibration.

It is important to note that there are may other possible ACLD configurations other than those demonstrated in FIGS. 3, 5 and 7. For example, the ACLD can be arranged in multilayer configurations (FIGS. 24–34) or in discrete patches (FIGS. 27–34) that are distributed at optimal locations over the vibrating structure. Other possible configurations are only limited by our imagination.

The visco-elastic damping material can be any plastically deformable fluid having a finite fluidity such as rubber, synthetic rubber, e.g., neoprene, or any polymer having such properties. Examples of commercially available visco-elastic materials include DYAD 601, 606, or 609 SOUND-COAT® (The Soundcoat Company, Deer Park, L.I., N.Y. 11729-5701); SD-40PSA, C-2003-05 or C-2203 IsoDamp® (E.A.R. Specialty Composites, Indianapolis, Ind. 46268); or ISD 110, 112, 113 SCOTCHDAMP® (3M Corporation, St. Paul, Minn. 55144-1000).

The piezo-electric layers may be made of any piezo-electric material such as polyvinylidene (PVDF) polymer or lead-zorcanium-titanate (PZT) ceramic. Examples of commercially available piezo-electric materials include KYNAR® (Pennwalt Corporation, King of Prussia, Pa. 19406-0018) and PTS-1195, PTS-1408, PTS-1512 and PTS-1278 (Piezo-Electric Products, Inc., Metuchen, N.J. 08840).

EXAMPLE 1

MATERIALS

An acrylic beam, whose main physical and geometrical properties are given in Table 1, was treated with the active constrained layer damping treatment (ACLD). The ACLD consisted of a visco-elastic sheet of DYAD-606 SOUND-COAT® (The Soundcoat Company, Deer Park, L.I., N.Y. 11729-5701) which was sandwiched between two piezo-electric layers. The piezo-electric layers were made from polyvinylidene fluoride polymer (PVDF2, film number S028NAO, Pennwalt Corporation, King of Prussia, Pa. 19406-0018). Table 1 also lists the physical and geometrical parameters of the visco-elastic and piezo-electric layers.

TABLE 1

Physical and Geometrical Properties of Beam and ACLD

| Layer | Length (mm) | Thickness (mm) | Density (kg/m$^3$) | Modulus (Mpa) |
|---|---|---|---|---|
| Beam | 127 | 0.635 | 2400 | 4500* |
| Visco-elastic | 55 | 0.254 | 1104 | 20** |
| Piezo-electric | 55 | 0.711 | 1800 | 2250* |

*Young's modulus
**shear modulus

METHODS

Figure 8:
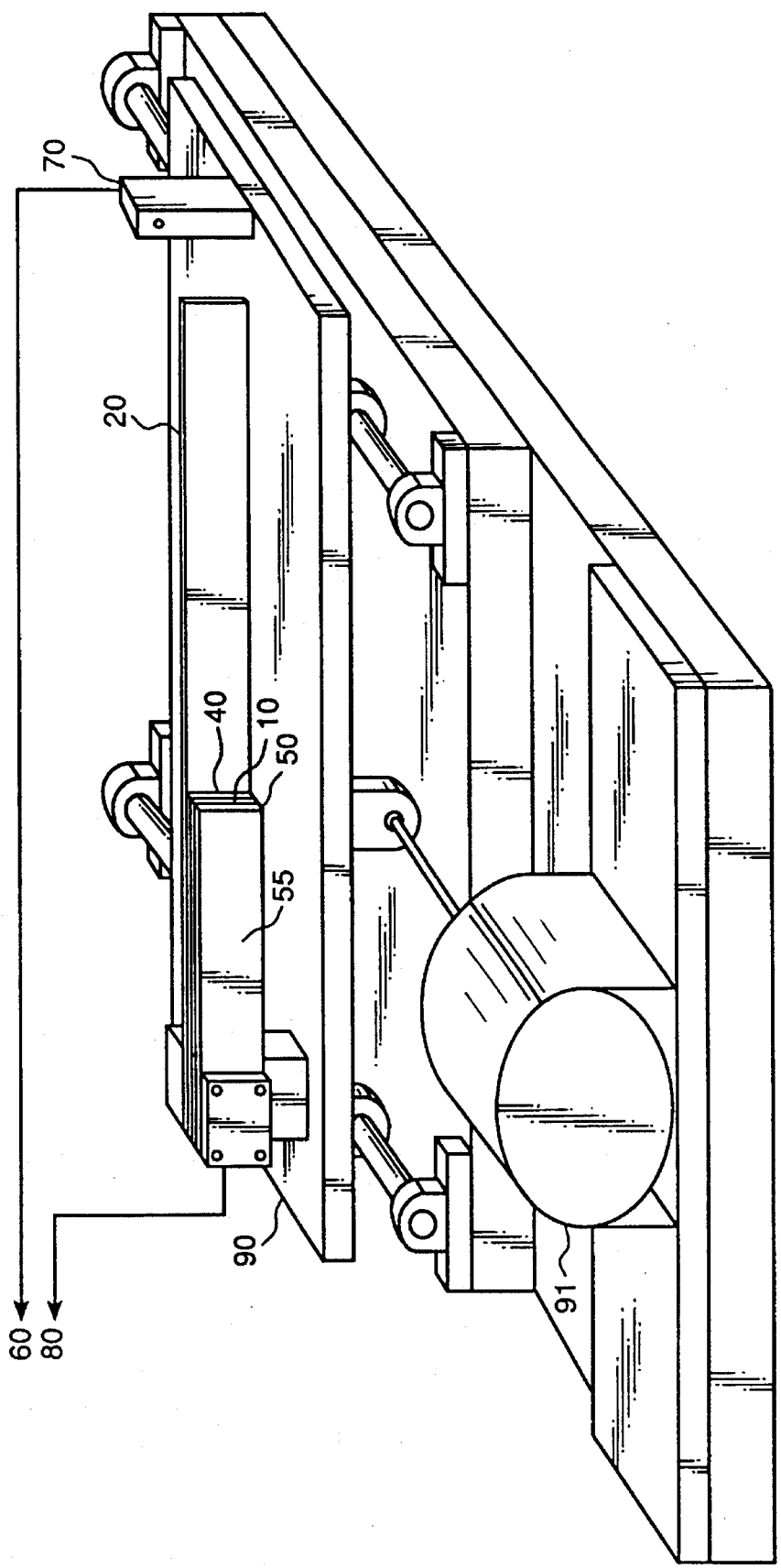
FIG. 8 is a schematic representation of a device used to test the ACLD treatment. The flexible beam (20) with the active constrained layer damping device (55) attached thereto is placed on an oscillating table (90) which is excited by a mechanical shaker (91) at different frequencies. The motion of the beam (20) with and without activation of the ACLD (55) is monitored, via computer (80), using the piezo-sensor (40) as well as a laser sensor (70) for comparisons.

FIG. 8 is a schematic representation of the experimental set-up used in testing the effectiveness of the active constrained layer damping (55) in attenuating the vibration of the test beam (20) as compared to conventional passive constrained layer damping and to simple proportional active controller. The beam, under consideration, is mounted in a cantilevered manner on an oscillating table (90) which is excited by a shaker (91) driven by sinusoidal or white noise source through a power amplifier. The amplitude of vibration of the free end of the beam is monitored by a laser sensor (70) which is mounted on the oscillating table. The output signal of the laser sensor is sent to a spectrum analyzer to determine the vibration attenuation both in the time and frequency domains.

RESULTS

Figure 9:
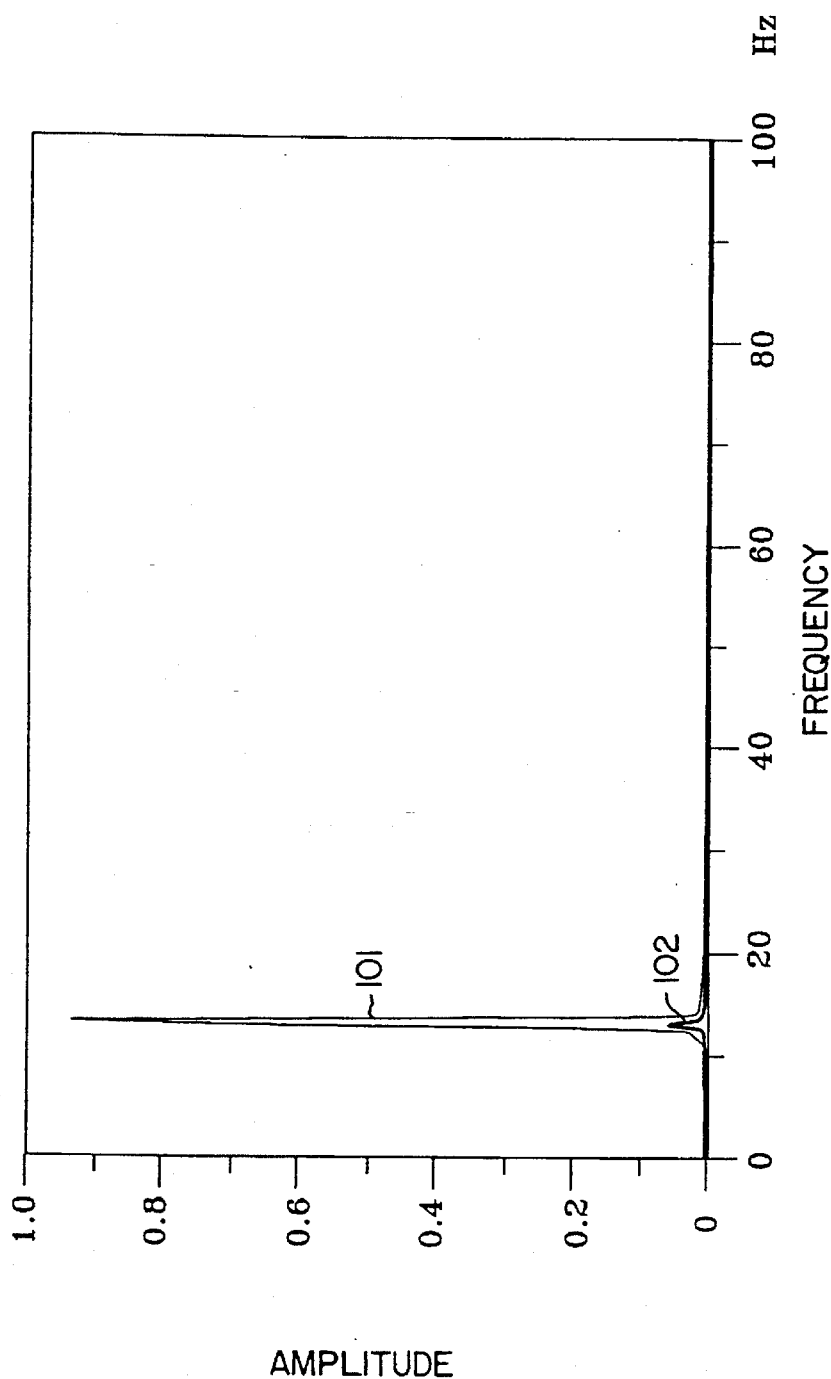
FIG. 9 shows the frequency response of the uncontrolled beam 101 as compared to that of an optimally controlled beam treated with the active constrained layer damping 102. The beam was excited at its first mode of vibration.
Figure 10:
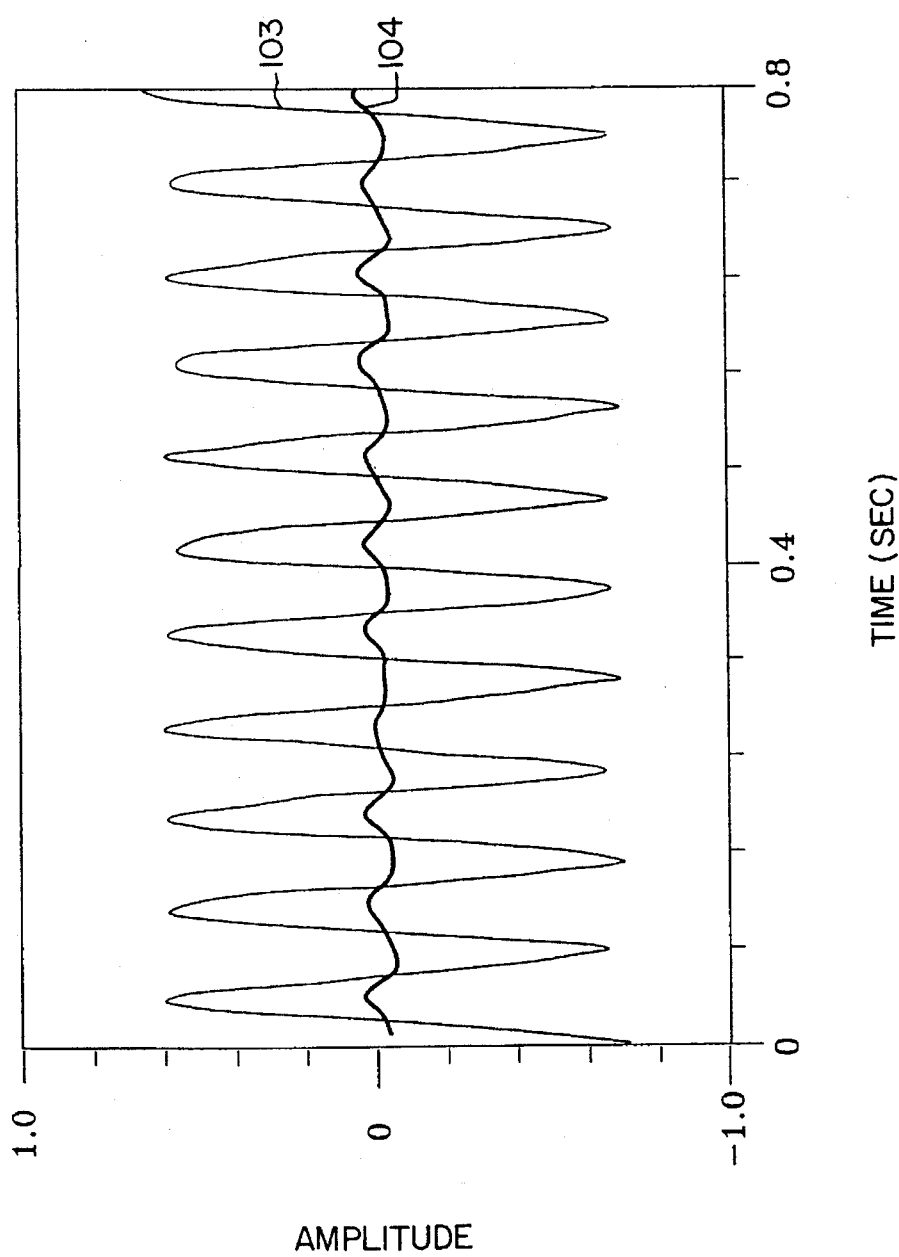
FIG. 10 shows the time response of the uncontrolled beam 103 as compared to that of an optimally controlled beam treated with the active constrained layer damping 104. The beam was excited at its first mode of vibration.
Figure 11:
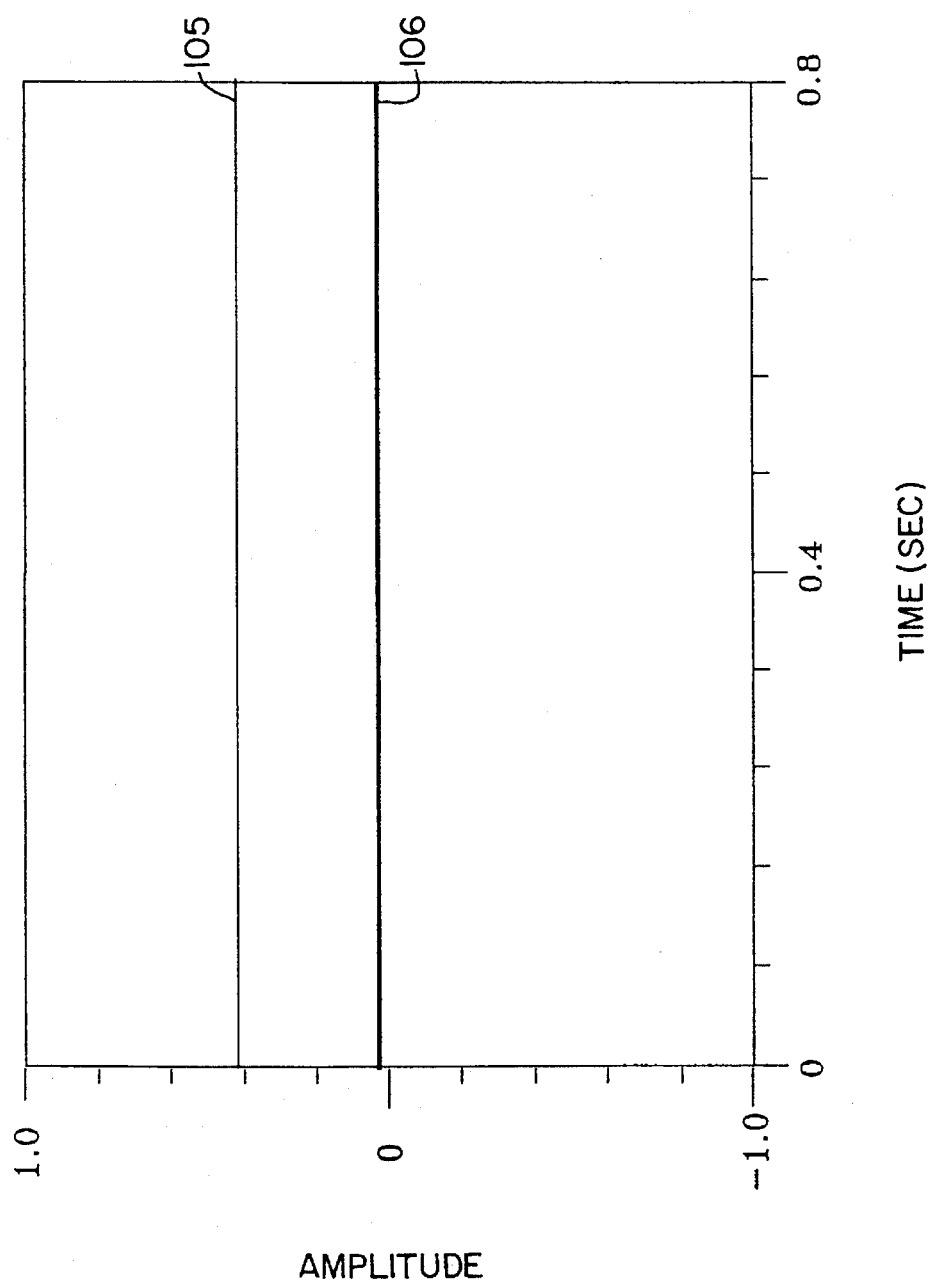
FIG. 11 shows the Root-Mean Square of the time response of the uncontrolled beam 105 as compared to that of an optimally controlled beam treated with the active constrained layer damping 106. The beam was excited at its first mode of vibration.

FIGS. 9–11 show a comparison between the amplitudes of vibration of the beam when it was controlled by passive constrained layer damping, the ACLD and a proportional active controller. The results displayed in the figures are obtained when the beam is excited at its first mode of vibration of 13.1 Hz. In FIGS. 9–11, the power spectrum of the resulting amplitude of vibration is shown for the three cases. The corresponding time response is displayed in FIG. 10 and the rms (Root-Mean Square) value of the amplitude is shown in FIG. 11. It is evident that the ACLD resulted in an excellent attenuation as compared to the individual passive or active systems. This emphasizes the importance of combining the excellent attributes of the active and passive systems in one optimal system.

Figure 12:
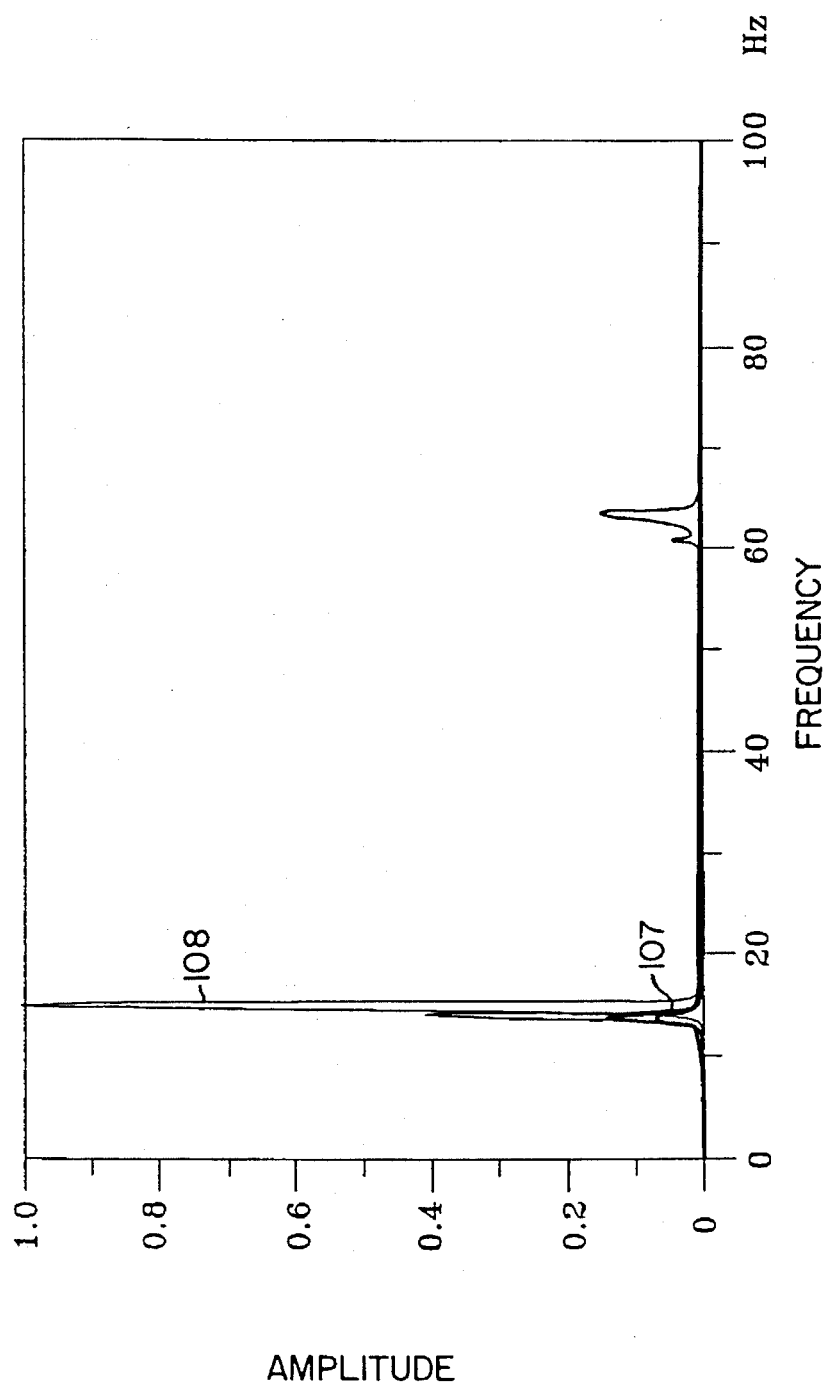
FIG. 12 shows the frequency response of the uncontrolled beam as compared to those of a controlled beam treated with the active constrained layer damping at different values of the control gain. The optimum gain 107 is shown as the smallest peak (relative amplitude of 0.1, the uncontrolled 108 is shown as the largest peak (relative amplitude of 1.0), with the low gain peak (0.14) above the optimum gain peak and the high gain peak (0.4) above the low gain peak and below the uncontrolled peak. The beam was excited at its first mode of vibration.
Figure 13:
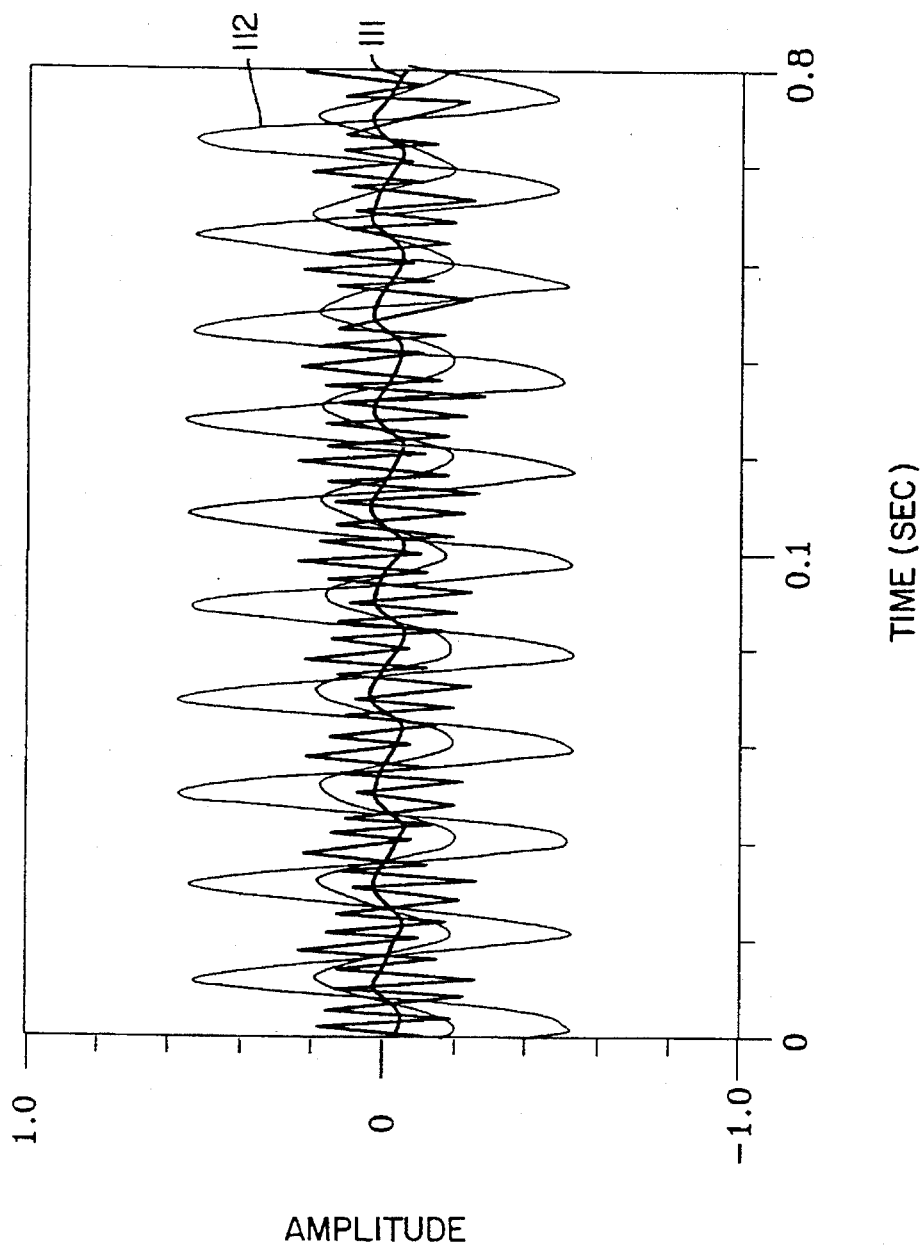
FIG. 13 shows the time response of the uncontrolled beam as compared to those of a controlled beam treated with the active constrained layer damping at different values of the control gain. The optimum gain 111 is represented by the central wave, the uncontrolled 112 as the waves of greatest amplitude, with the high gain as the spiked waves and the low gain as the waves intermediate between those for the high gain and those for the optimum gain. The beam was excited at its first mode of vibration.
Figure 14:
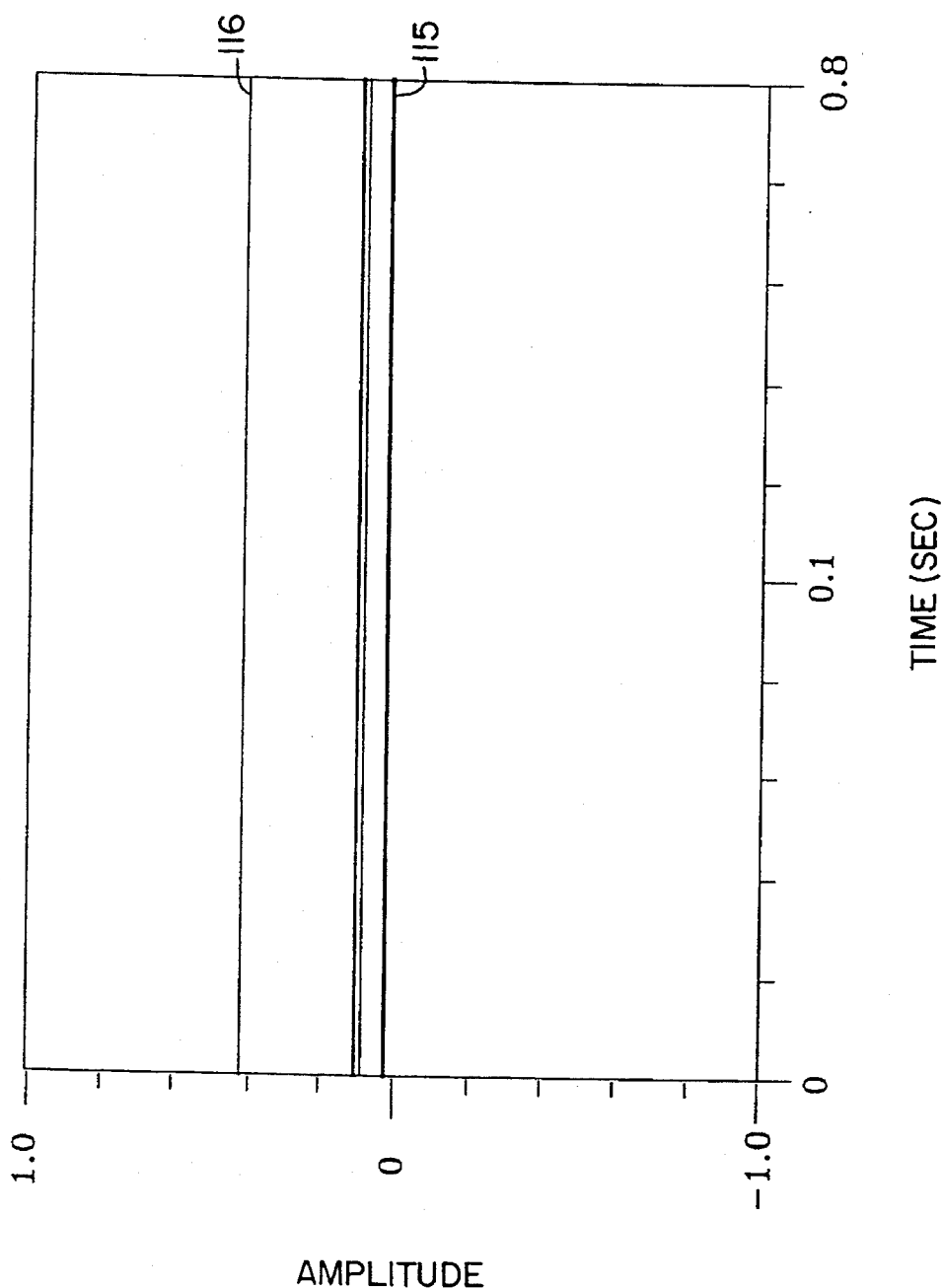
FIG. 14 shows the Root-Mean Square time response of the uncontrolled beam as compared to those of a controlled beam treated with the active constrained layer damping at different values of the control gain. The optimum gain 115 is represented by the line nearest to zero amplitude and the uncontrolled 116 as the line with the greatest amplitude with the lower gain nearer to the optimum gain and the higher gain above the lower gain and below the uncontrolled. The beam was excited at its first mode of vibration.
Figure 15:
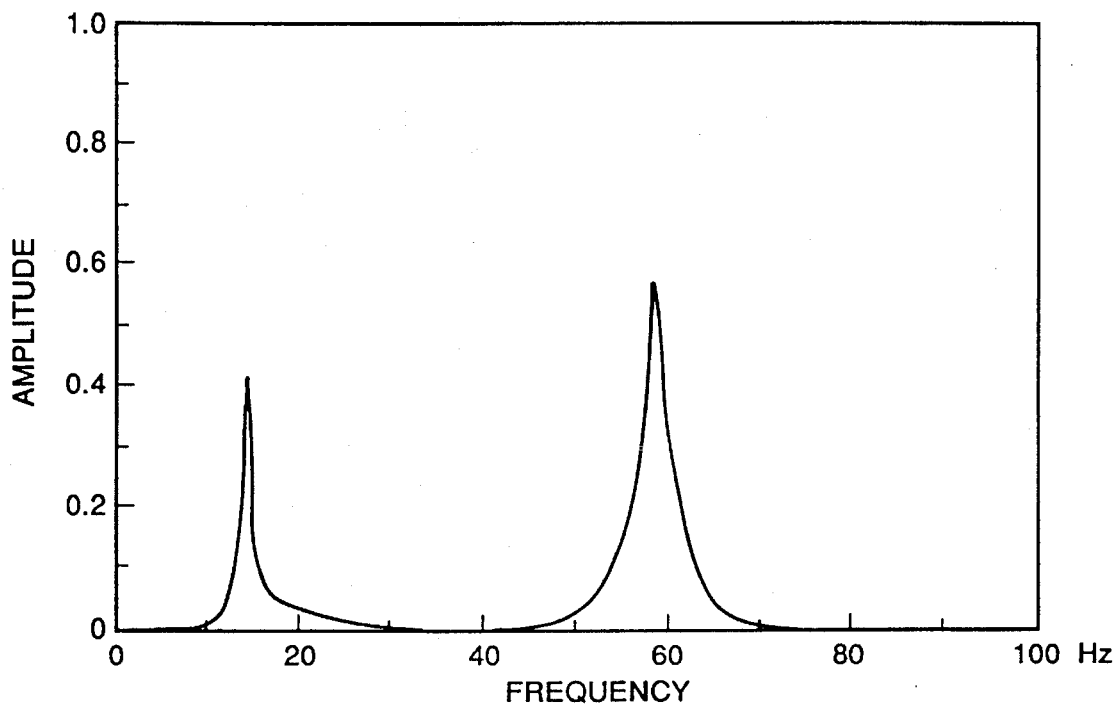
FIG. 15 shows the frequency response of the uncontrolled beam when it was excited with broad band excitation.
Figure 16:
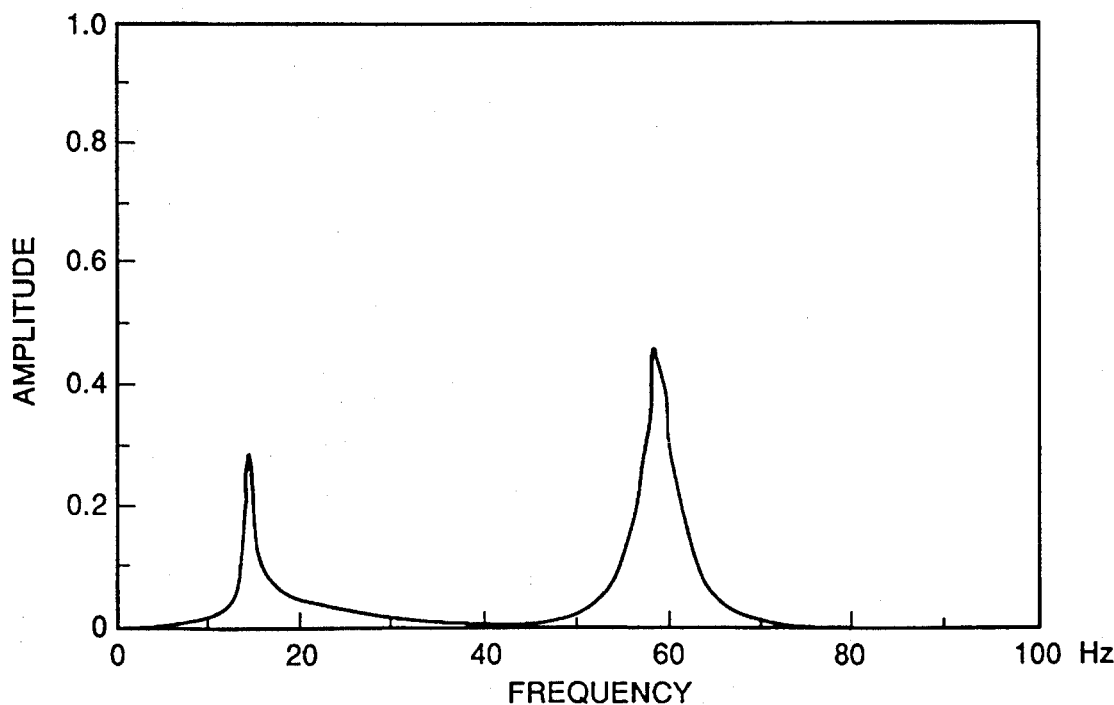
FIG. 16 shows the frequency response of a controlled beam treated with the active constrained layer damping treatment when the control gain is low. The beam was excited with broad band excitation.
Figure 17:
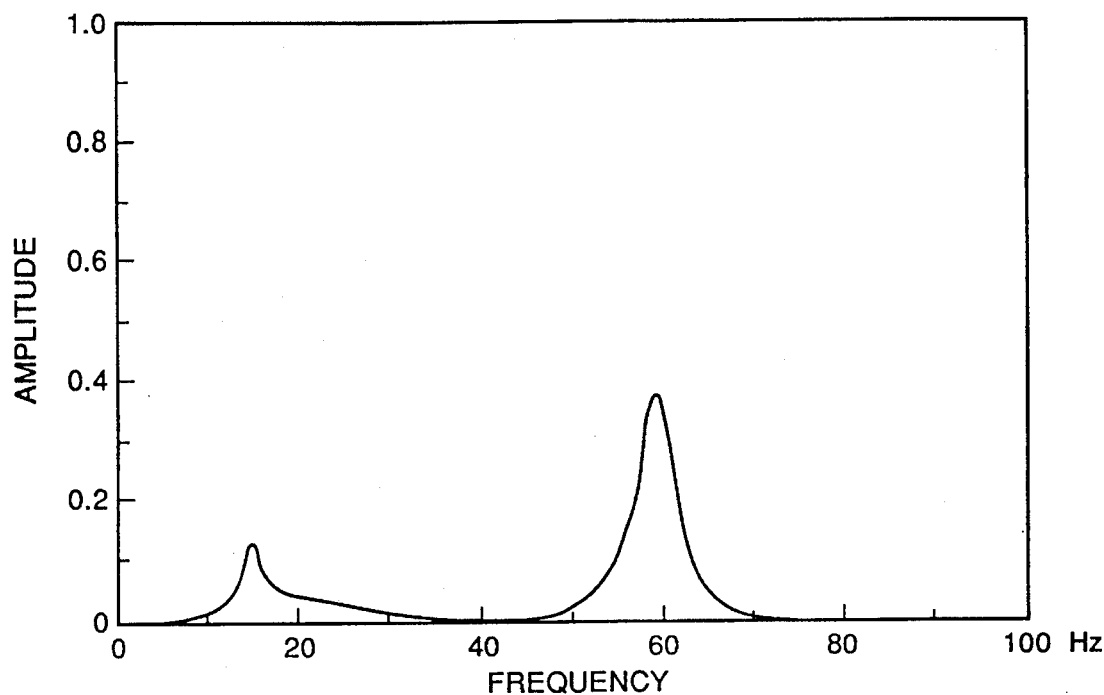
FIG. 17 shows the frequency response of a controlled beam treated with the active constrained layer damping when the control gain is optimal. The beam was excited with broad band excitation.
Figure 18:
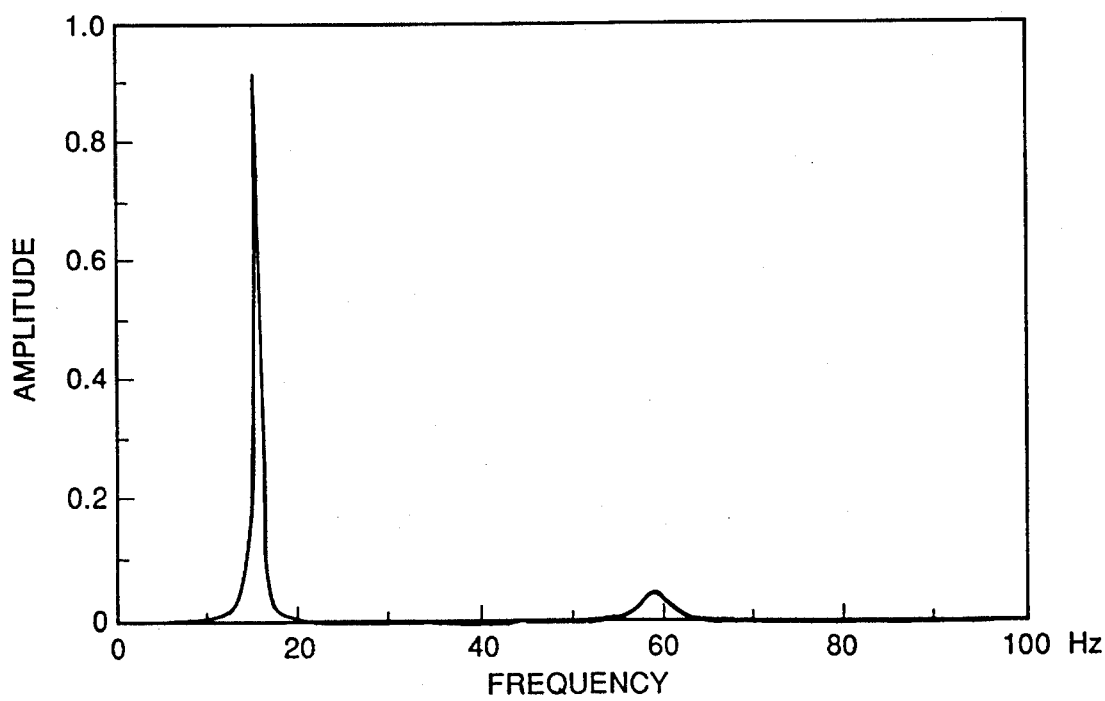
FIG. 18 shows a frequency response of a controlled beam treated with the active constrained layer damping when the control gain is high. The beam was excited with broad band excitation.
Figure 19:
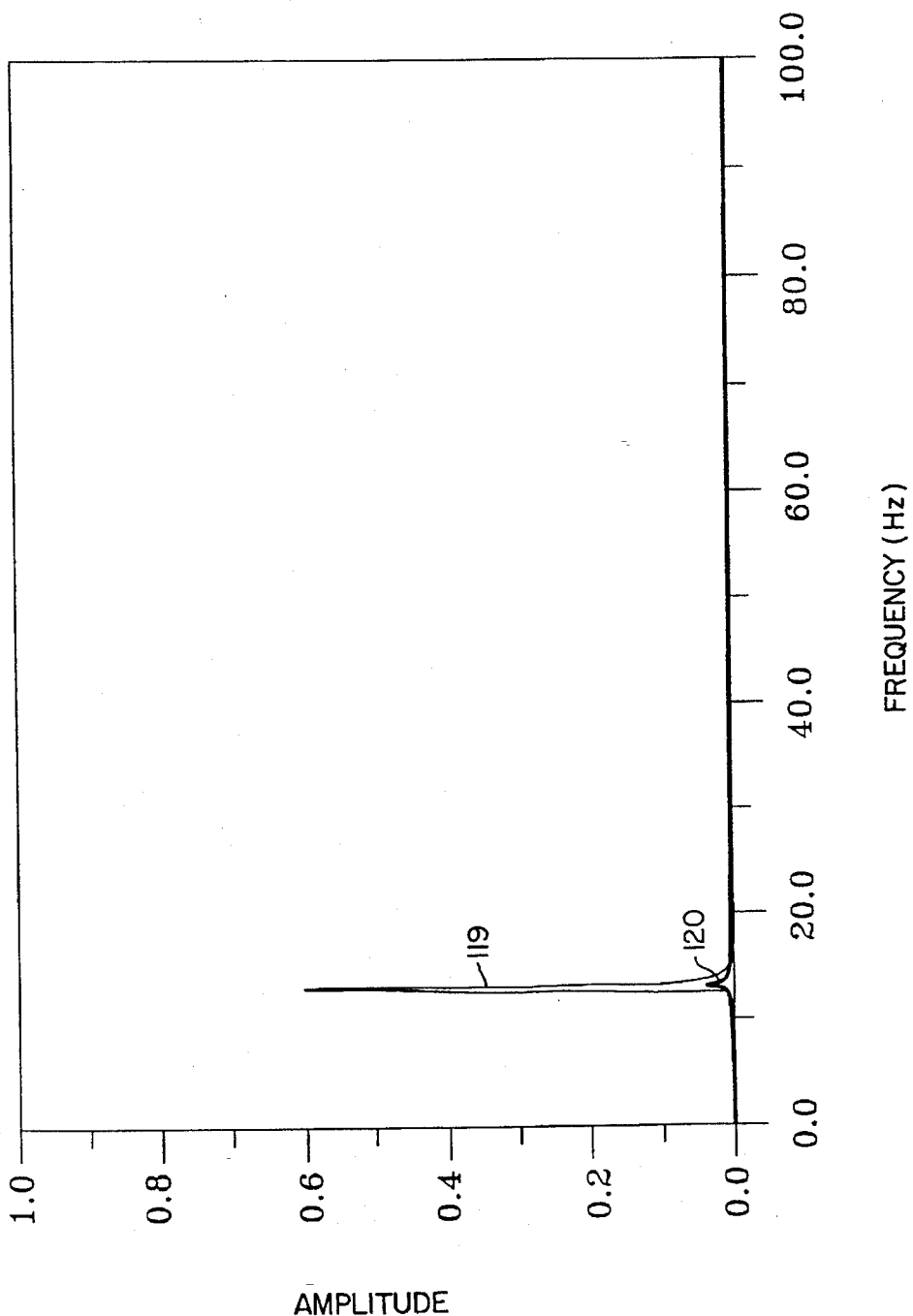
FIG. 19 shows the frequency response of the uncontrolled beam 119 as compared to that of an optimally controlled beam treated with the active constrained layer damping 120 at an operating temperature of 20° C. The beam was excited at its first mode of vibration (13.16 Hz).
Figure 20:
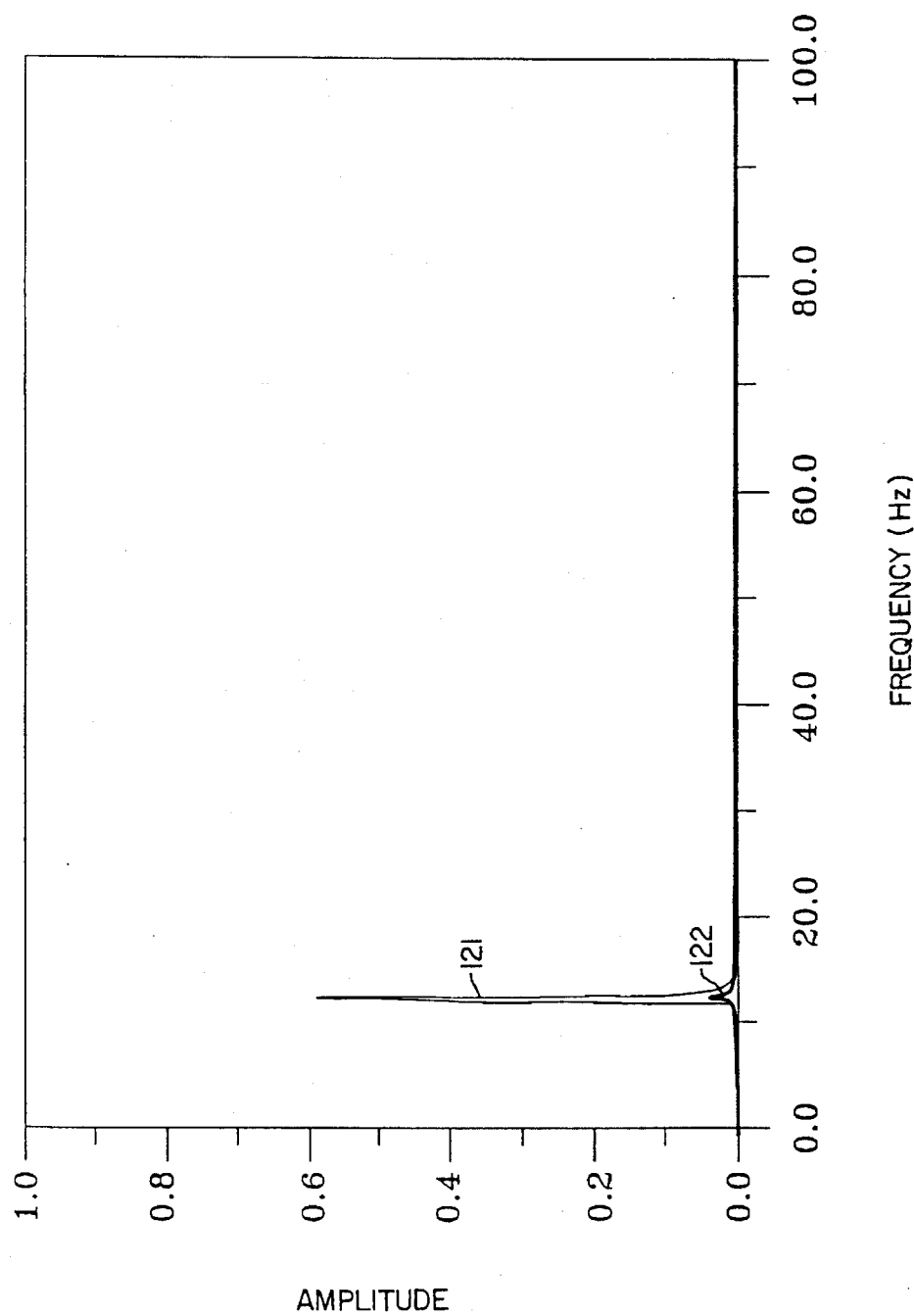
FIG. 20 shows the frequency response of the uncontrolled beam 121 as compared to that of an optimally controlled beam treated with the active constrained layer damping 122 at an operating temperature of 30° C. The beam was excited at its first mode of vibration (12.94 Hz).
Figure 21:
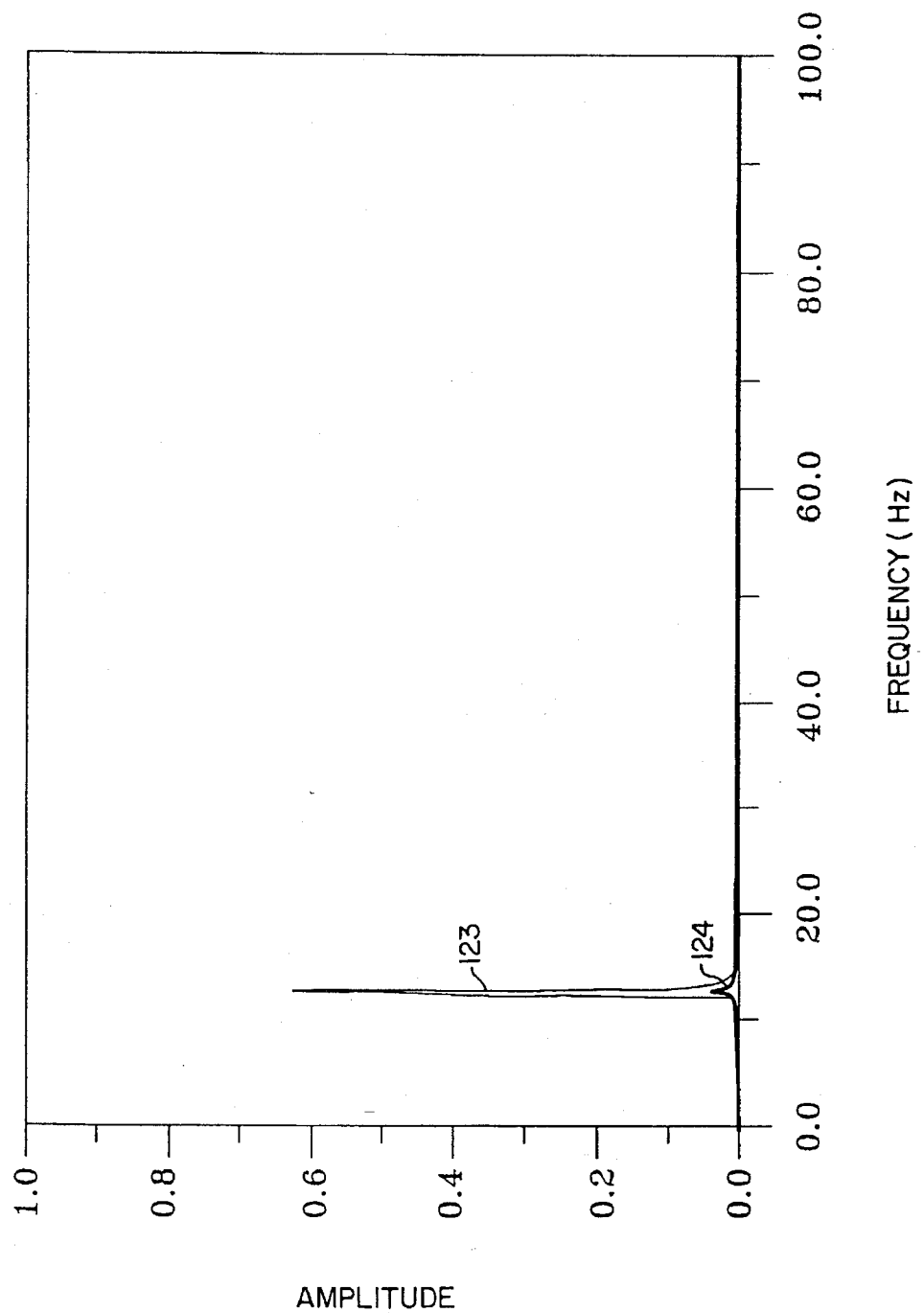
FIG. 21 shows the frequency response of the uncontrolled beam 123 as compared to that of an optimally controlled beam treated with the active constrained layer damping 124 at an operating temperature of 40° C. The beam was excited at its first mode of vibration (12.82 Hz).
Figure 22:
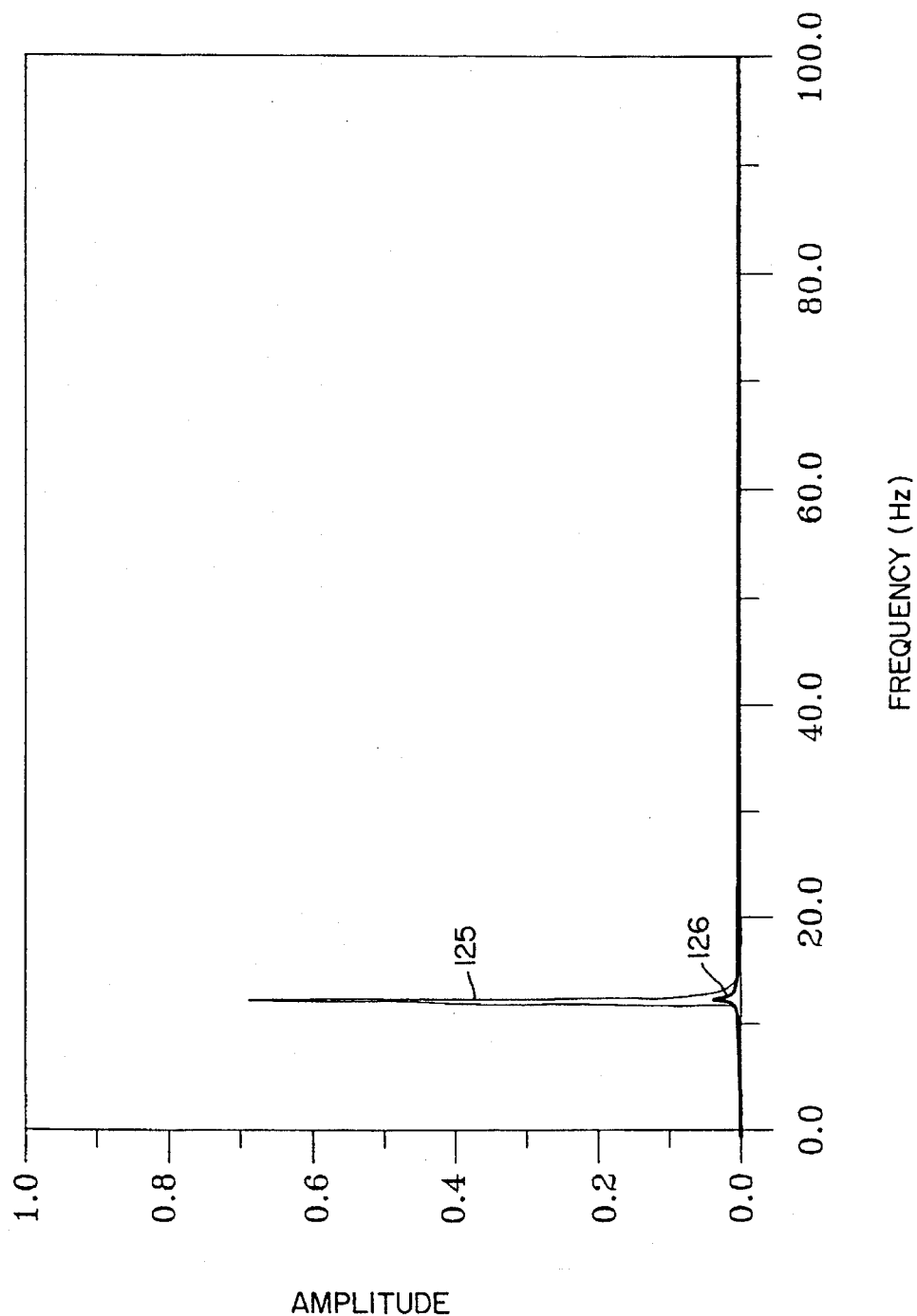
FIG. 22 shows the response of the uncontrolled beam 125 as compared to that of an optimally controlled beam treated with the active constrained layer damping 126 at an operating temperature of 50° C. The beam was excited at its first mode of vibration (12.58 Hz).

FIGS. 12–14 show the effect of the ACLD gain setting on its performance when the beam is excited at its first mode of vibration. This gain, which amplifies the piezo-electric sensor signal and drives the piezo-electric constraining layer, plays a very important role in the behavior of the ACLD. The results obtained indicate that there is an optimal gain setting at which the attenuation is maximum. Smaller gains will not be as effective and higher gains will result in exciting the higher modes of vibration of the beam as indicated in FIG. 12.

FIGS. 15–18 show a comparison between the performance of the ACLD and the passive constrained layer damping in the frequency domain when the beam is excited with white noise vibrations. The figures show also the effect that the ACLD gain setting has on optimizing the attenuation of vibration over wide frequency band.

Figure 23:
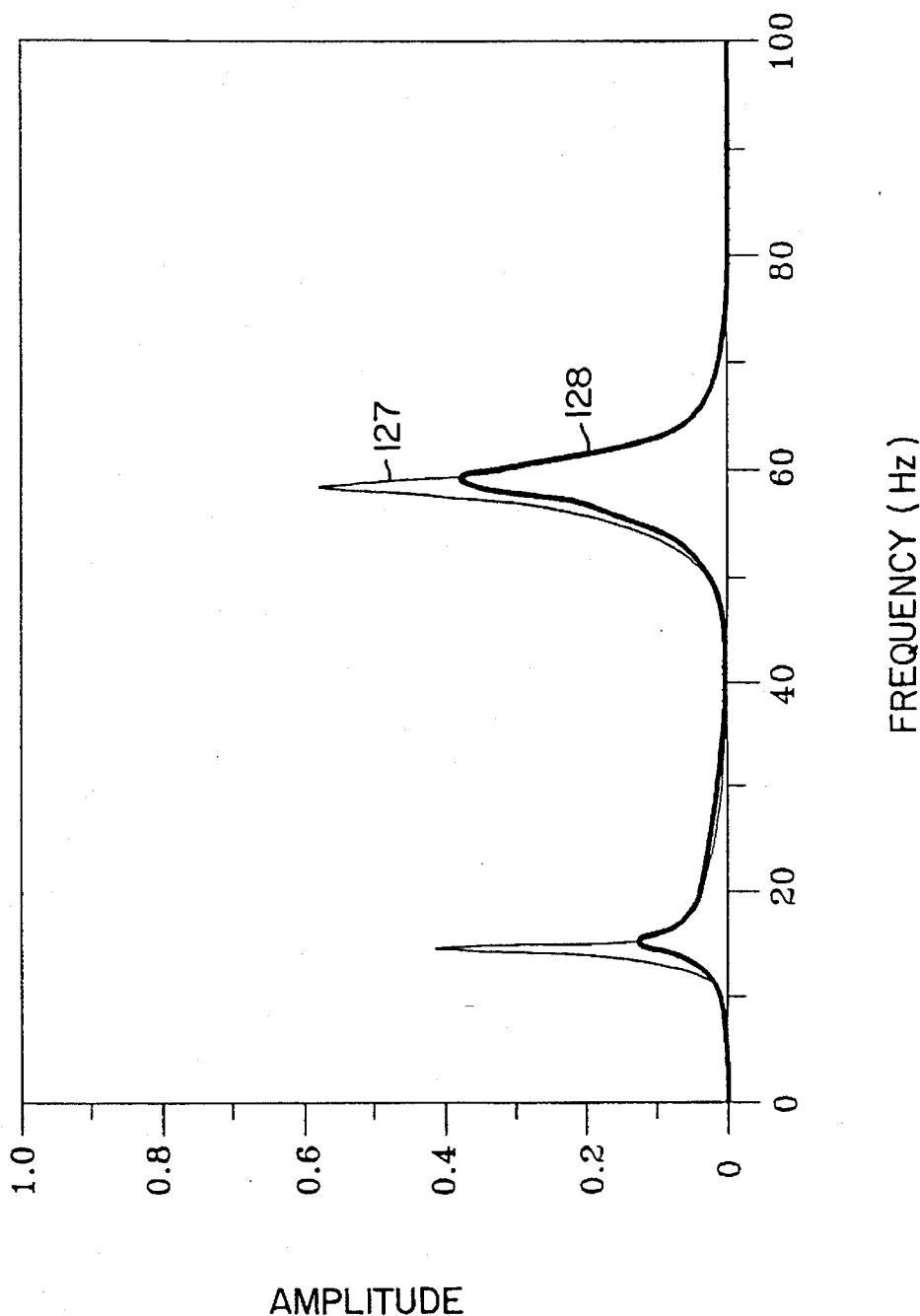
FIG. 23 shows the frequency response of the uncontrolled beam 127 as compared to that of an optimally controlled beam treated with the active constrained layer damping 128 at an operating temperature of 20° C. The beam was excited with broad band white noise excitations.
Figure 24:
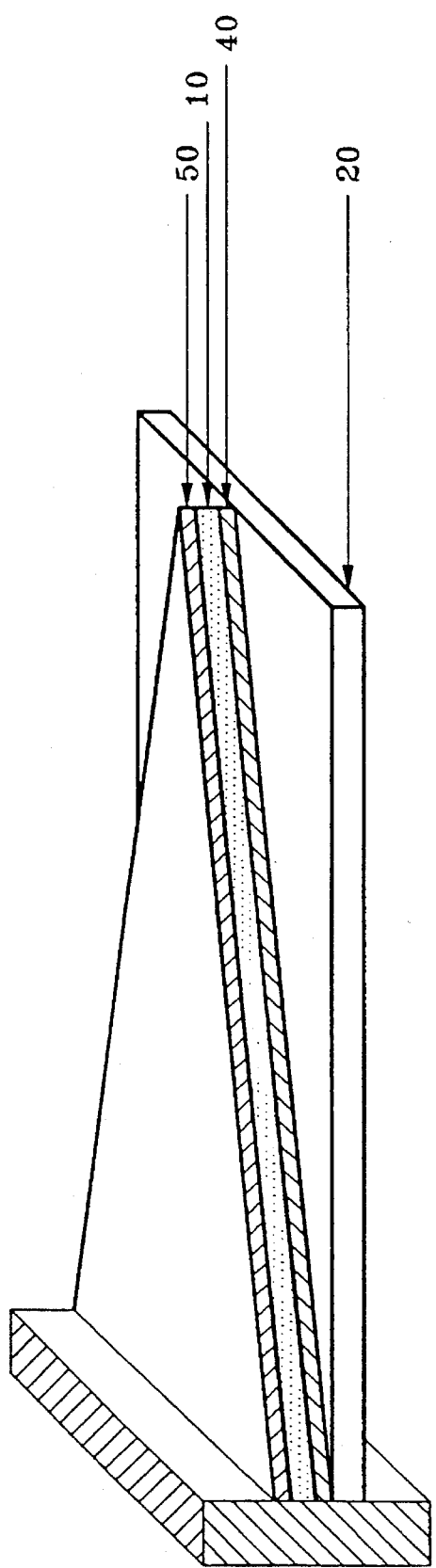
FIG. 24 is a schematic representation of a flexible structure (20) treated with a shaped active constrained layer damping device with the sensor (40), visco-elastic (10) and constraining layers (50) being shaped. The structure is treated with a specially shaped active constrained layer damping in order to target a critical vibration mode, for example, the first mode of vibration. Other shapes are also possible to control higher modes of vibration as well as torsional modes. In this design, the piezo-sensor, the visco-elastic and the piezo-constraining layers are shaped. As such, the ACLD is used primarily to control the first bending mode of vibration.
Figure 25:
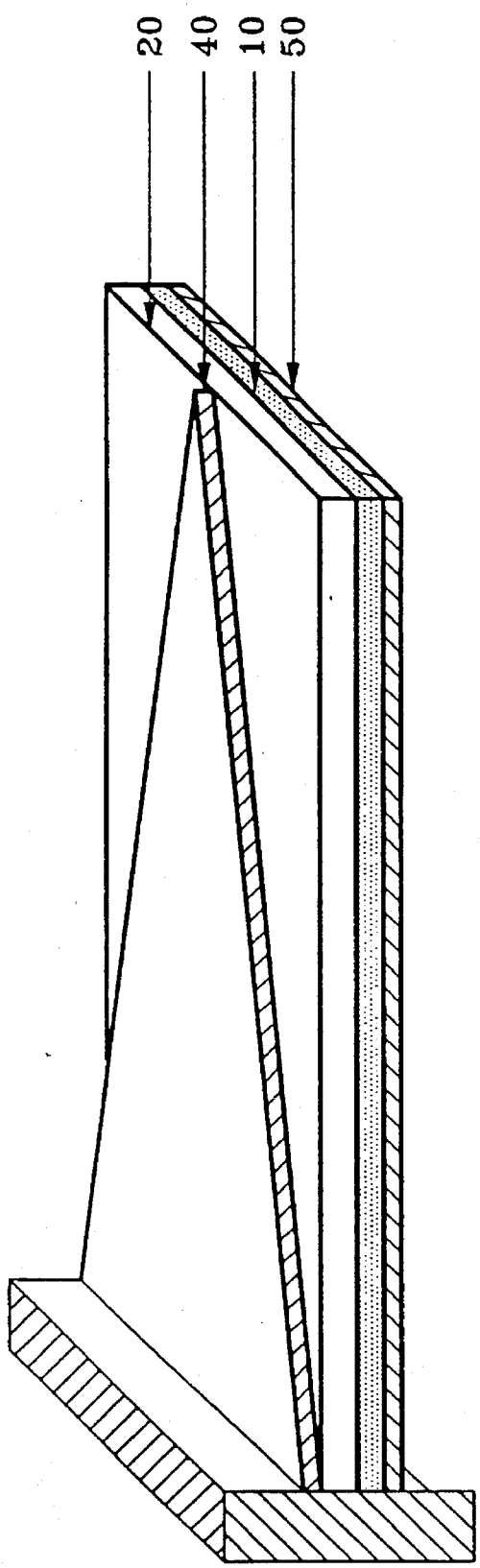
FIG. 25 shows a flexible structure (20) treated with active constrained layer damping but only the sensor (40) layer is shaped while the visco-elastic layer (10) and the active constraining layer (50) are fully maintained. The structure is treated with a specially shaped sensor layer damping in order to target a critical vibration mode, for example, the first mode of vibration. Other shapes are also possible to control higher order modes as well as torsional modes. In this design, only the piezo-sensor layer is shaped while the piezo-constraining layer and the visco-elastic layer are fully maintained. As such, the ACLD is used to control the first bending mode of vibration.
Figure 26:
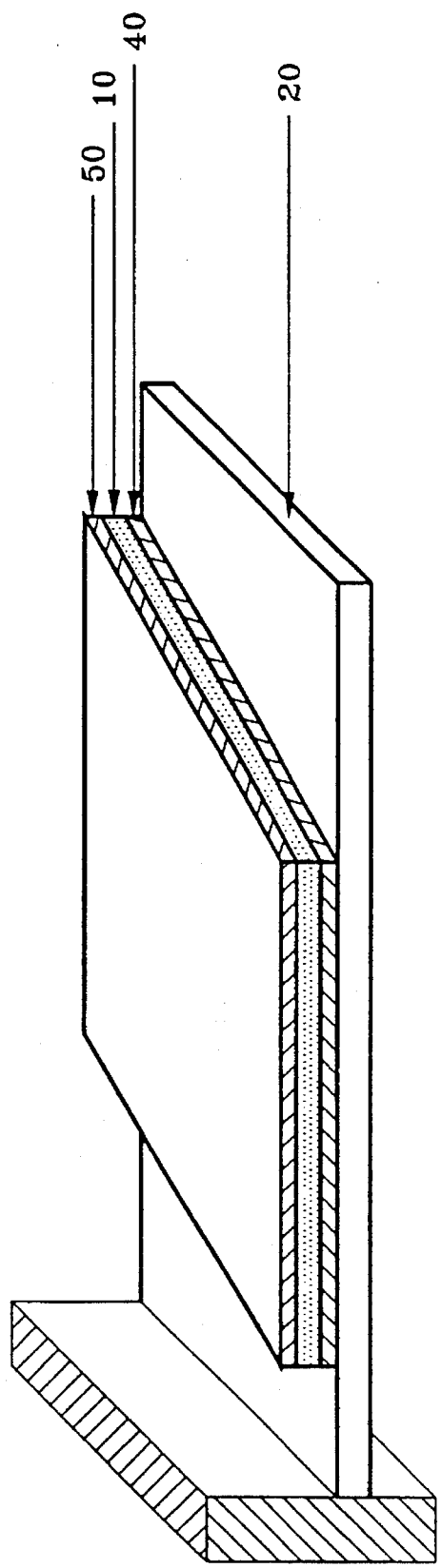
FIG. 26 shows a flexible beam (20) treated with shaped active constrained layer damping with the sensor (40), visco-elastic (10) and constraining layers (50) being shaped. The structure is treated with a specially shaped active constrained layer damping in order to target a critical vibration mode, for example, the first mode of vibration. Other shapes are also possible to control higher order modes as well as torsional modes. In this design, the piezo-sensor, the visco-elastic and the piezo-constraining layers are shaped. The shaped ACLD is used in this arrangement to control both the bending and torsional deflections of the beam.
Figure 27:
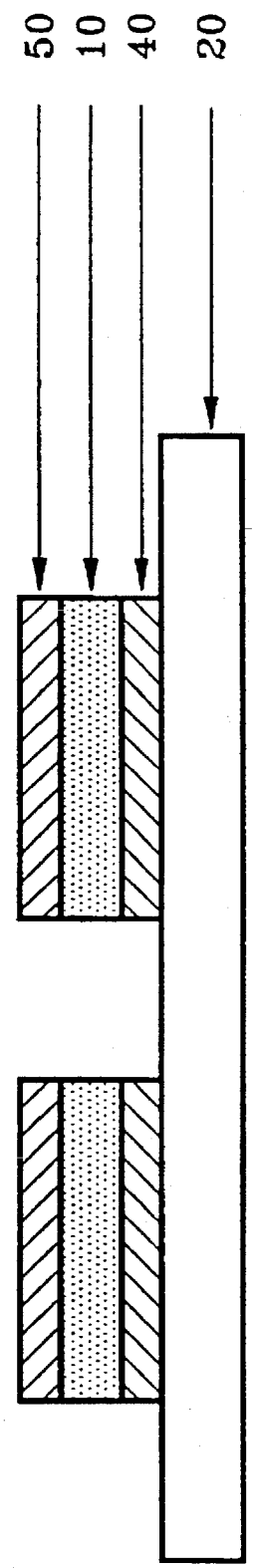
FIG. 27 shows a plate (20) treated with patches of active constrained layer damping. Flexible plates are treated with patches of ACLD placed at optimal locations to primarily control several bending modes of vibrations. The ACLD patches are made of the piezo-sensor (40), the visco-elastic (10) and the piezo-constraining layers (50).
Figure 28:
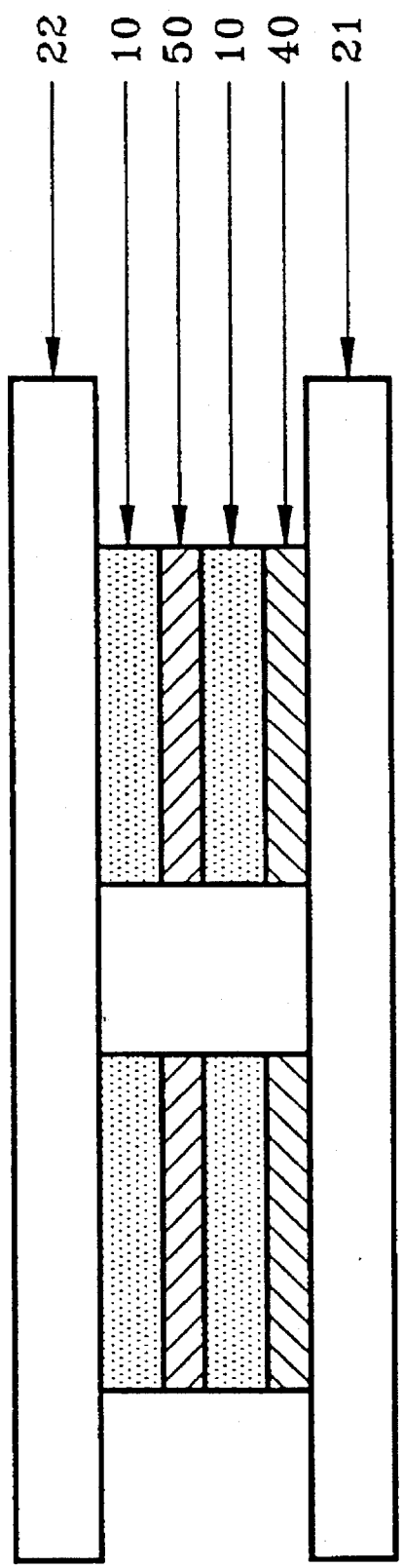
FIG. 28 shows a sandwiched plate treated with patches of active constrained layer damping. Sandwiched flexible plates (21, 22) are treated with patches of ACLD placed at optimal locations to primarily control several bending modes of vibrations. The ACLD patches are made of four layers unlike the design outlined in FIG. 27. The four layers include the piezo-sensor (40), the visco-elastic (10), the piezo-constraining layer (50) and another visco-elastic layer (10) bonded to the back plate (22). In this manner, it is possible to double the damping action as the active piezo-constraining layer will simultaneously operate on both of the visco-elastic layers.
Figure 29:
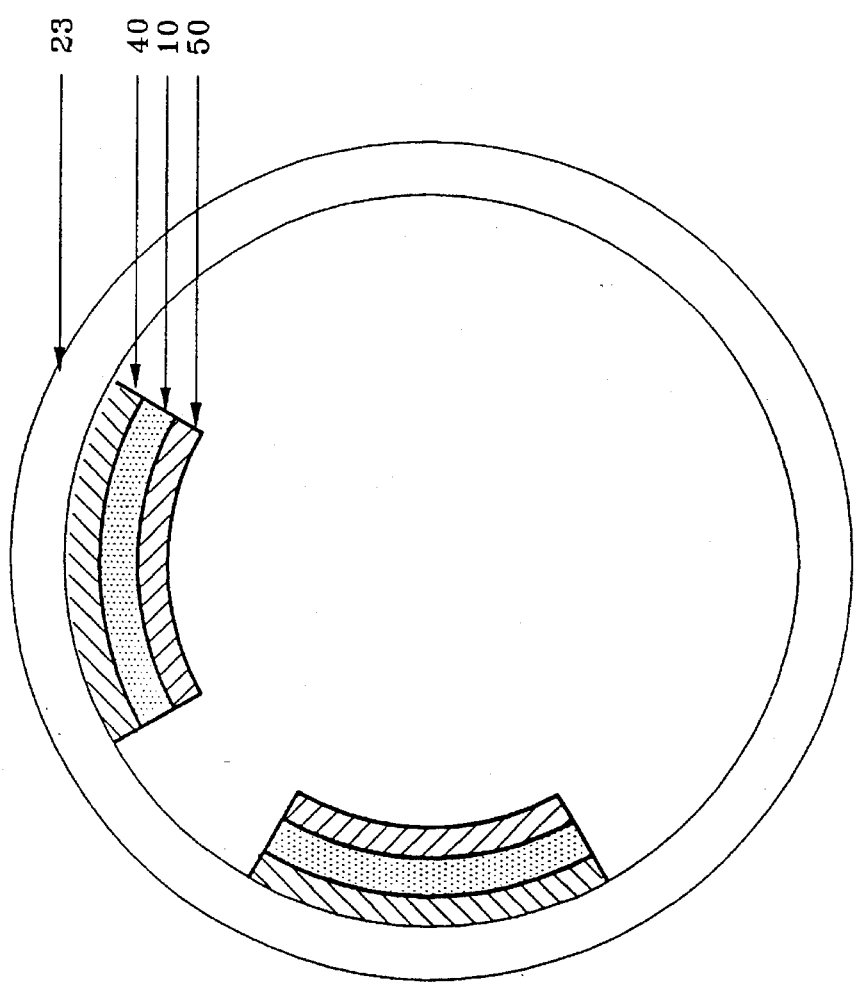
FIG. 29 shows a cylinder (23) treated with patches of active constrained layer damping. Flexible cylinders (shells or enclosures) are treated with patches of ACLD placed at optimal locations to control several modes of vibrations. The ACLD patches are made of the piezo-sensor (40), the visco-elastic (10) and the piezo-constraining layers (50).
Figure 30:
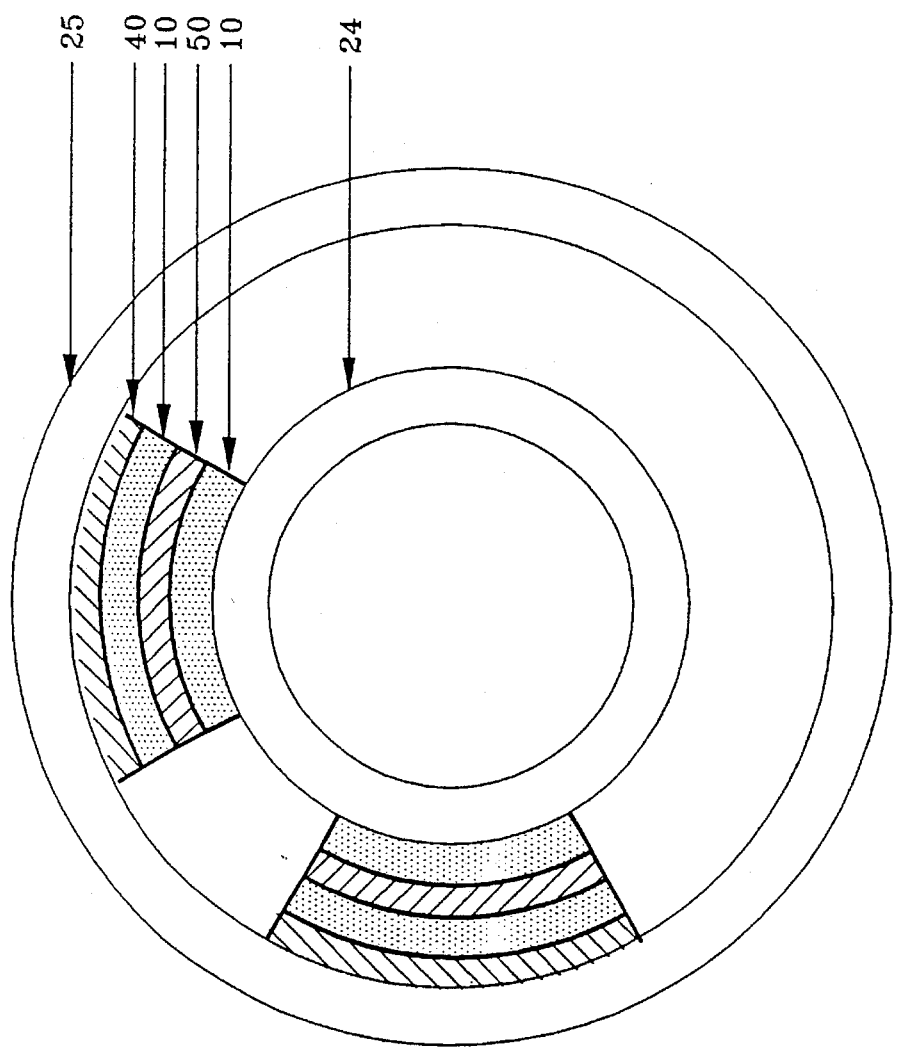
FIG. 30 shows sandwiched cylinders (24, 25) treated with patches of active constrained layer damping. Sandwiched flexible cylinders (shells or enclosures) are treated with patches of ACLD placed at optimal locations to control several modes of vibrations. The ACLD patches are made of four layers unlike the design outlined in FIG. 29. The four layers include the piezo-sensor (40), the visco-elastic (10), the piezo-constraining (50) and another visco-elastic layer (10) bonded to the inner shell (24). In this manner, it is possible to double the damping action as the active piezo-constraining layer will simultaneously operate on both of the visco-elastic layers.
Figure 31:
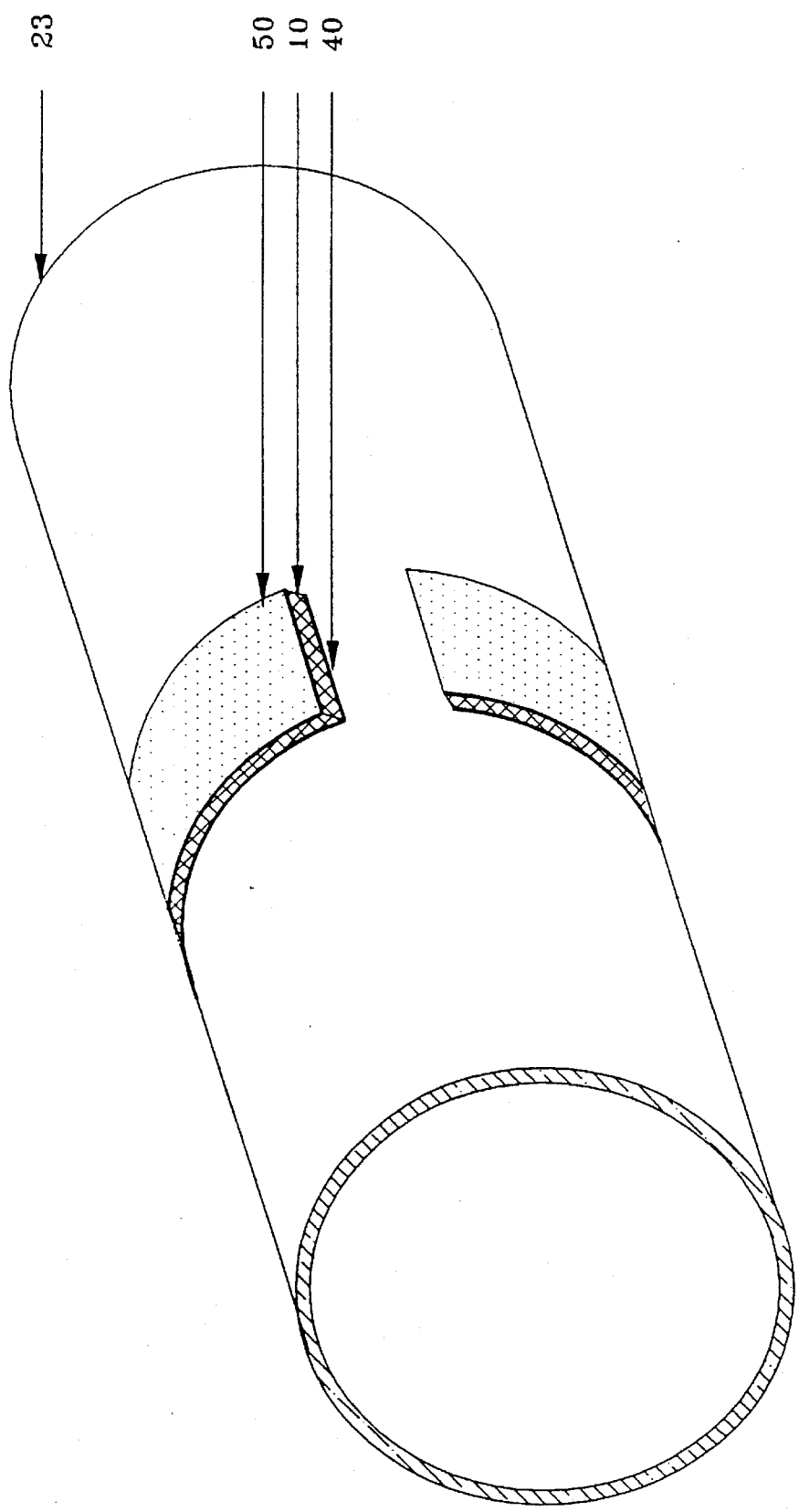
FIG. 31 shows an active constrained layer damping of the breathing modes of cylindrical shells. The ACLD treatment (full or patches) is arranged with the actuation direction of the active constraining layer lined up or aligned with the tangential (hoop) direction of the cylindrical shell (23) which is perpendicular to its longitudinal axis.
Figure 32:
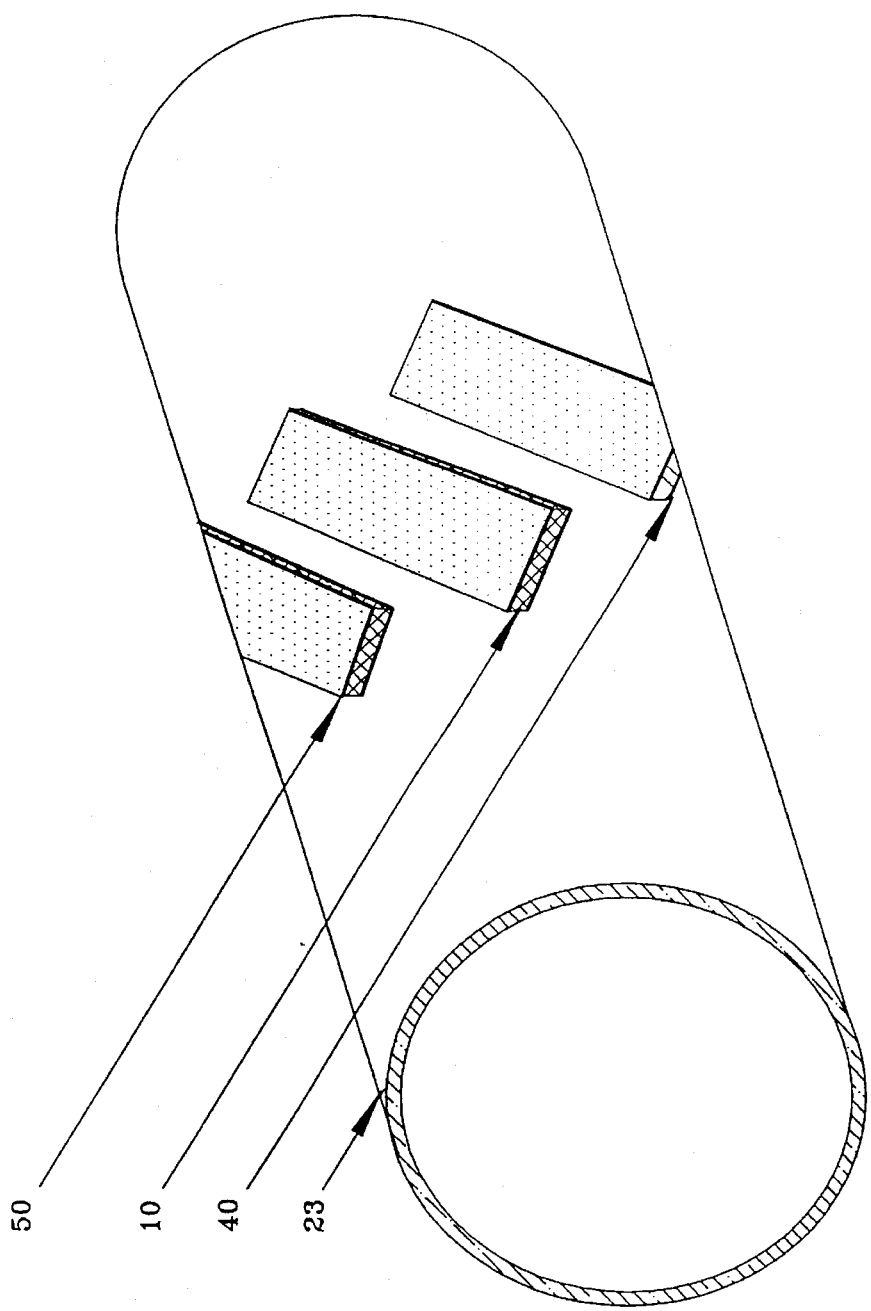
FIG. 32 shows active constrained layer damping of the torsional modes of cylindrical shells. The ACLD treatment (full or patches) is arranged with the actuation direction of the active constraining layer lined up or aligned with the tangential (hoop) direction of the cylindrical shell (23) which is inclined at an optimal angle to its longitudinal axis. Several patches can be used to enhance the damping characteristics of the treatment.
Figure 33:
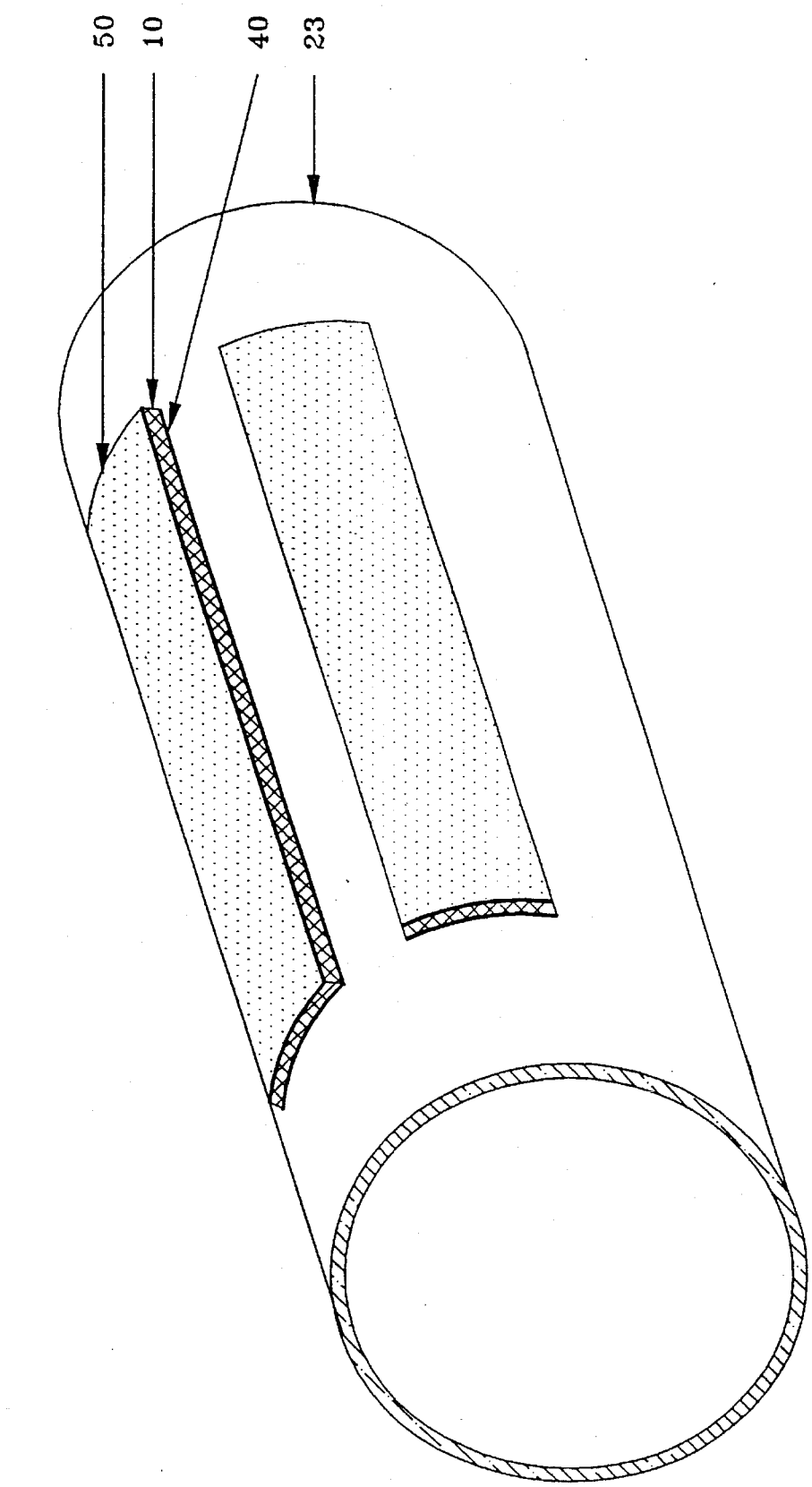
FIG. 33 shows active constrained layer damping of the bending modes of cylindrical shells. The ACLD treatment (full or patches) is arranged with the actuation direction of the active constraining layer lined up or aligned with the longitudinal axis of the cylindrical shell (23). Several patches can be used to enhance the damping characteristics in all directions.
Figure 34:
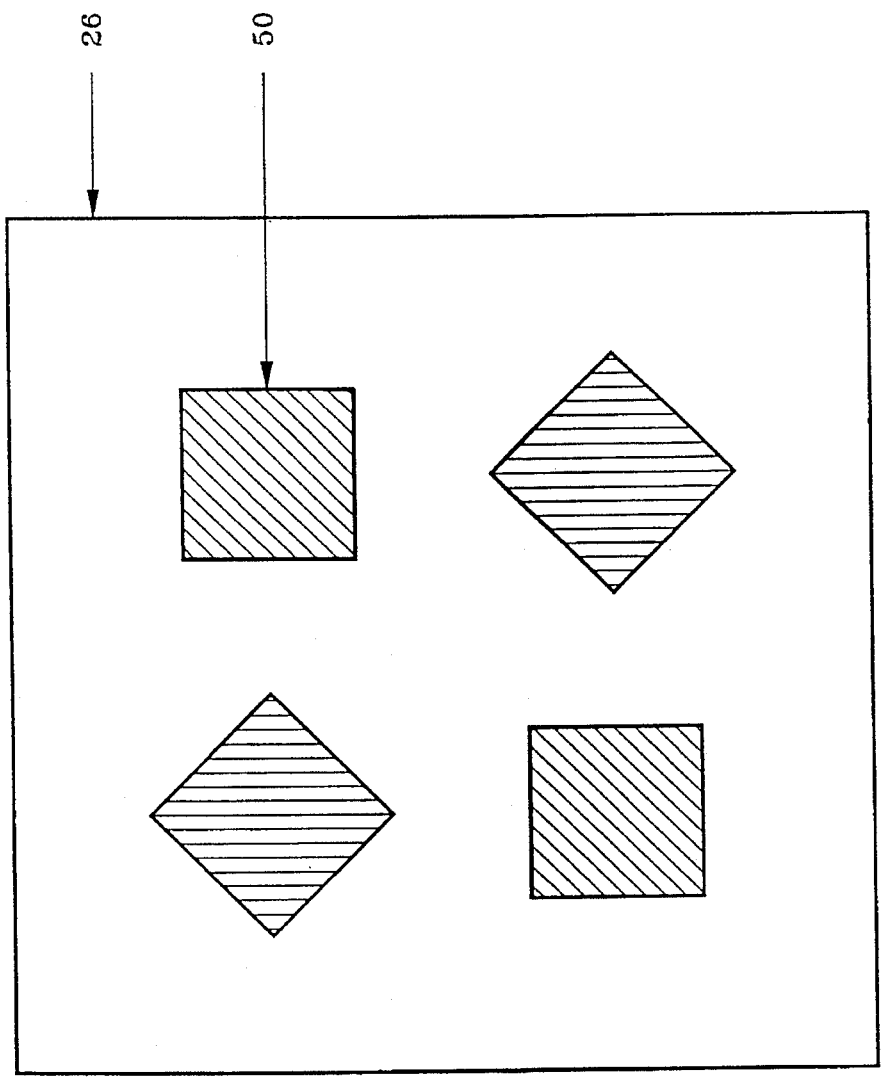
FIG. 34 shows a plate (26) treated with patches of active constrained layer damping with multi-actuation directions. Flexible plates are treated with patches of ACLD placed at optimal locations to primarily control several bending and torsional modes of vibrations. The ACLD patches are made of the piezo-sensor, the visco-elastic and the piezo-constraining layers.

FIGS. 19–22 show the effect of temperature on the frequency response with a single mode of excitation. FIG. 23 shows the frequency response at 20° C. with multiple modes of excitation.

EXAMPLE 2

METHOD

Figure 35:
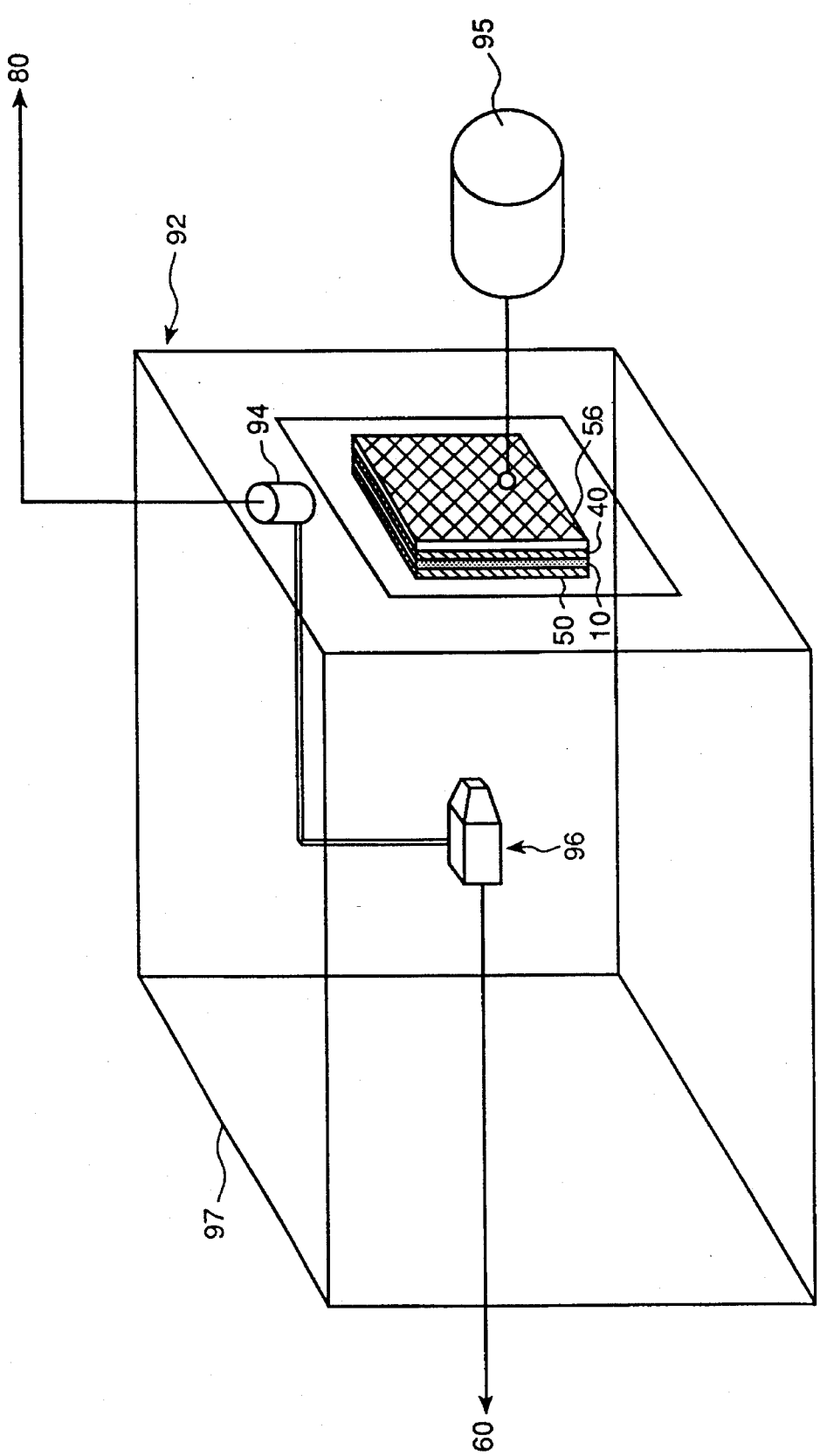
FIG. 35 is a schematic representation of a device used to test the ACLD for sound damping. A fiber glass composite (56) was treated with a single patch of the ACLD treatment to control the first mode of vibration.

A fiber glass composite plate (56) measuring 9 in×9 in×0.084 in was treated with a single patch of the ACLD treatment to control the first mode of vibration. The plate (56) was mounted on a wall cavity or frame (92) of an anechoic chamber (97) as shown in FIG. 35. The plate (56) was excited mechanically by a mechanical shaker (95) which was driven by a sinusoidal signal generator. The sound radiating from the plate (56) was monitored by a microphone (96) mounted inside the anechoic chamber (97). The directivity of the sound radiation was determined by moving the microphone (96) through the use of a computer-controlled servo-motor sysytem (94).

RESULTS

A summary of the sound attenuation results obtained by controlling the ACLD treatment with a proportional control action is given in Table 2 for different values of the control gain.

TABLE 2

Effect of Control Gain on the Attenuation of the Sound Radiation from a Plate Treated with ACLD

| Gain | Sound Attenuation (db)* |
|---|---|
| Low gain | 4.52 |
| Optimum gain | 12.63 |
| Large gain | 6.76 |

*attenuations were computed relative to the uncontrolled plate (the plate was excited at its first mode of vibration)

Vibration or sound control of large flexible structures is essential to their successful operation as stable platforms for personnel, instruments, communications and weapons systems. The results obtained with the ACLD will provide optimum design tools and means for predicting the performance of a new class of actively-controlled constrained layer damping treatment. The active damping layer aims at damping out the vibrations and attenuating the sound radiated from beams, plates, panels, cylinders, enclosures and shells. Such characteristics are achieved by the built-in sensing and control capabilities of the active damping layer which optimizes the mix between the passive and active damping to attain optimal damping conditions that match the structural response to external disturbances. With such capabilities, the ACLD will provide enhanced damping characteristics and considerable weight reduction as compared to conventional passive surface damping treatments.

Therefore, the ACLD method and device have numerous potential commercial and military applications. Examples include damping out the vibration and attenuating the sound radiated from helicopter rotors and panels, interior of various types of critical vehicles and shells of submersibles, e.g., submarines. In all these applications, the weight saving due to the use of the ACLD can be significant as the size of the surface damping treatments used is relatively large. For example, in the case of helicopters such as HH-53 the area of the surface damping treatments applied is about 150 ft$^2$ (Nashif, Jones and Henderson, 1985).

Furthermore, the use of the ACLD will also produce significant performance improvement as compared to passive constrained layers. For example, passive coatings can attenuate the vibration of helicopter gear boxes by only 5 db (SOUNDCOAT® bulletin 811). With the ACLD, much higher attenuations are expected in view of the results presented above.

It is important to note that in spite of our emphasis on the use of the ACLD in vibration attenuation, it can be equally utilized to attenuate the sound radiation to and from enclosures, cabins, boxes, etc.

Apart from the above cited applications, many others are also possible and are only limited by our imagination.

ACLD is by no means limited to the suppression of vibrations of structures such as stationary beams, rotating beams, plates, panels, cylinders, shells or enclosures. The invention can be equally applied to the attenuation and containment of noise radiated from any vibrating structure. Based on the above results, it would be possible to use the invention in developing effective coatings for office equipment such as computers and printers, automotive interiors, gear boxes and engine blocks, machine tools, electric machinery, air and fluid handling systems, aerospace structures, rapid transit systems, buildings and auditoriums, escalators and elevators, etc.

The implications of the development of the ACLD are intuitively invaluable and its applications are only limited by the limit of our imagination.

REFERENCES

The following publications were either cited above or are provided for the general background of the invention and are incorporated herein by reference:

Alam, N. & Asnani, N. T., "Vibration and Damping Analysis of Multilayered Rectangular Plates with Constrained Viscoelastic Layers", *Journal of Sound and Vibration*, 97(4), 597–614 (1984).

Alam, N. & Asnani, N. T., "Refined Vibration and Damping Analysis of Multilayered Rectangular Plates", *Journal of Sound and Vibration*, 119(2), 347–362 (1987).

Amos, A., "Structural Control Research at AFOSR", Air Force Office of Scientific Research, AFOSR/NA, Bolling AFB, District of Columbia 20332, 1985.

Anderson, E. H., "Piezoceramic Actuation of One- and Two-Dimensional Structurals", *MIT Master's Thesis*, 1989.

Aronson, R., (ed.), "Rediscovering Piezo-Electrics", Machine Design, Vol. 56, No. 14., pp. 73–77, 1984.

Asnani, N. T. & Nakra, B. C., "Vibration Damping Characteristics of Multilayered Beams with Constrained Viscoelastic Layers", *ASME Trans. Journal of Engineering for Industry*, 895–901 (1976).

Bailey, T. and J. Hubbard, Jr., "Distributed Piezo-electric Polymer Active Vibration Control of a Cantilever Beam", J. of Guidance and Control, Vol. 8, pp. 605–611, 1985.

Barbieri, E. and Ozguner, U, "Unconstrained and Constrained Mode Expansions for a Flexible Slewing Link", J. of Dynamic Systems, Measurements and Control, Trans. of ASME, Vol. 110, pp. 416–421, 1988.

Bauchau, O. A., "A Beam Theory for Anisotropic Materials", Journal of Applied Mechanics, 1985, Vol. 52, pp. 416–422.

Baumgarten, O. R. & Pearce, B. K., "The Damping Effects of Viscoelastic Materials Part 1—Transverse Vibrations of Beams with Viscoelastic Coatings", ASME Trans *Journal of Engineering for Industry*, 7, 645–650 (1971).

Baz, A., "Experimental Control of the Vibration of Flexible Beams with Piezo-Electric Bimorphs", U.S. Army Research Office, Grant Number 23185-EG-II, August 1985.

Baz, A. and S. Poh, "Performance of an Active Control System with Piezo-electric Actuators", J. of Sound and Vibration, Vol. 126, No. 2, pp. 327–343, 1988.

Baz, A. and S. Poh, "Experimental Implementation of the Modified Independent Modal Space Control Method, J. of Sound and Vibration, Vol. 139, pp. 133–149, 1990.

Baz, A., S. Poh and J. Fedor, "Independent Modal Space Control with Positive Position Feedback", ASME J. of Dynamic Systems, Measurements and Control, Vol. 114, No. 1, January 1992.

Baz, A., S. Poh and P. Studer, "Optimal Vibration Control of Flexible Beams Using Piezo-electric Actuators", Proc. of the 6th Conference on the Dynamics and Control of Large Structures, VPI & State University, Blacksburg, Va. June 1986, pp. 217–234.

Baz, A., S. Poh and P. Studer, "Modified Independent Modal Space Control Method for Active Control of Flexible Systems", Journal of Institution of Mechanical Engineering, Part C, Vol. 203, pp. 102–113, 1989.

Bailey, T. and J. Hubbard, "Distributed Piezoelectric Polymer Active Vibration Control of a Cantilever Beam", *Journal of Guidance and Control*, Vol. 8, pp. 606–611, 1985.

Bert, C. W.,, "Material Damping: An Introductory Review of Mathematical Models, Measures and Experimental Techniques", *Journal of Sound and Vibration*, 29(2), 129–153 (1973).

Bland, D. R. and Lee, E. H., "Calculation of the Complex Modulus of Linear Viscoelastic Materials from Vibrating Reed Measurements", J. of Applied Physics, Vol. 26, No. 12, pp. 1497–1503, 1985.

Caughey, T. and C. Gob, "Analysis and Control of Quasi-Distributed Parameter Systems", California Institute of Technology, Dynamics Laboratory Report Number DYNL-82-3, November 1982.

Corsaro, R. and Sperling, L. H., *Sound and Vibration Damping with Polymers*, American Chemical Society, Washington, D.C., 1990.

Crandall, S. H., "The Role of Damping In Vibration Theory", *Journal of Sound and Vibration*, 11(1), 3–18 (1970).

Crawley, E. and J. De Luis, "Use of Piezoelectric Actuators as Elements in Intelligent Structures" *Journal of AIAA*, Vol. 25, No. 10, pp. 1373–1385, 1987.

"Actuators in Large Space Structures", Proc. of the 26th Structures, Structural Dynamics and Materials Conference, Part 2, AIAA-SME-ASCE, Orlando, Fla., pp. 126–133.

DiTaranto, R. A., "Theory of Vibratory Bending for Elastic and Viscoelastic Layered Finite-Length Beams", *ASME Trans Journal of Applied Mechanics*, 881–886 (1965).

DiTaranto, R. A., "Composite Loss Factors of Selected Laminated Beams", *The Journal of the Acoustical Society of America*, 40(1), 187–194 (1966).

DiTaranto, R. A., "Composite Damping of Vibrating Sandwich Beams", *ASME Trans Journal of Engineering for Industry*, 633–638 (1967).

DiTaranto, R. A., "Static Analysis of a Laminated Beam", *ASME Trans Journal of Engineering for Industry*, 755–761 (1973).

Douglas, B. E., "Transverse Compressional Damping in the Vibratory Response of Elastic-Viscoelastic-Elastic Beams", *AIAA Journal*, 16(9), 925–930 (1978).

Fanson, J. and T. Caughey, "Positive Position Feedback Control of Large Space Structures", AIAA Paper Number 87-0902, 1987.

Forward, R., "Electronic Damping of Orthogonal Bending Modes in a Cylindrical Mast", J. of Spacecraft, Vol. 18, pp. 11–17, 1981.

Freymann, R. F. and E. Stümper, "Active Damping of a Large Lightweight Structure Using Piezo-electric Sensors and Actuators", *AIAA Paper Number* 91-1001-CP, 1991.

Gandhi, M. and B. Thompson, "A New Generation of Revolutionary Ultra-Advanced Intelligent Composite Materials Featuring Electro-Rheological Fluids", Proc. of US Army Research Office Workshop, VPI & State University, Blacksburg, Va., September 15–16, 1988.

Gorman, D. J., "Free Vibration Analysis of Cantilever Plates by the Method of Superpositions", J. of Sound & Vibration, Vol. 49, pp. 453–467, 1976.

Grootenhuis, P., "The Control of Vibrations with Viscoelastic Material", *Journal of Sound and Vibration*, 11(4), 421–433 (1970).

Ha, K. H., "Finite Element Analysis of a Sandwich Plates: An Overview", *Computers and Structures*, 37(4), 397–403 (1990).

Hagood, N., and A. von Flotow, "Damping of Structural Vibrations with Piezoelectric Materials and Passive Electrical Networks", *Proc. od DAMPING 89 Conference*, West Palm Beach, Fla., pp. ICC-1– ICC-31, February 1989.

Hanagud, S., et al., "Piezo-ceramic Devices and PVDF Films as Sensors and Actuators for Intelligent Structures", Proc. of U.S. Army Workshop, VPI & State University, Blacksburg, Va, September 1988.

He, J. F. and Ma., B. A., "Analysis of Flexural Vibration of Viscoelastically Damped Sandwich Plates", *Journal of Sound and Vibration*, 126(1), 37–47, (1988).

Hoa, S. V., "Vibration of a Rotating Beam with Tip Mass", *J. of Sound & Vibration*, Vol. 67, No. 3, pp. 369–381, 1979.

Hodges, D. H., "A Review of Composite Rotor Blade Modeling", Proceedings of the AIAA 29th SDM Conference, Apr. 18–20, 1988, Williamsburg, Va., pp. 305–312.

Huang, T. C. & Huang, C. C., "Free Vibrations of Viscoelastic Timoshenko Beams", *ASME Trans. Journal of Applied Mechanics*, 515–521 (1971).

Hwang, S. J. & Gibson, R. F., "The Effects of Three-Dimensional States of Stress on Damping of Laminated Composites", *Composites Science and Technology*, 41, 379–393 (1991).

IEEE Standards 176–1978, "IEEE Standards on Piezoelectricity", pp. 9–14, 1978.

Johnson, C. D. & Kienholz, D. A., "Finite Element Prediction of Damping in Structures with Constrained Viscoelastic Layers", *AIAA Journal*, 20(9), 1284–1290 (1982).

Im, S. and S. N. Atluri, "Effects of a Piezoactuator on A Finitely Deformed Beam Subjected to General Loading", *Journal of AIAA*, Vol. 27, pp. 1801, 1989.

Jones, D. I. G., Nashif, A. D. & Parin, M. L., "Parametric Study of Multiple-Layer Damping Treatments on Beams", *Journal of Sound and Vibration*, 29(4), 423–434 (1973).

Kerwin, E. M., Jr., "Damping of Flexural Waves by a Constrained Viscoelastic Layer", *The Journal of the Acoustical Society of America*, 31(7), 952–962 (1959).

Khatua, T. P. & Cheung, Y. K., "Bending and Vibration of Multilayer Sandwich Beams and Plates", *International Journal for Numerical Methods in Engineering*, 6, 11–24 (1973).

Killian, J. W. & Lu, Y. P., "A Finite Element Modeling Approximation for Damping Material Used in Constrained Damped Structures", *Journal of Sound and Vibration*, 97(2), 352–354 (1984).

Korites, B. J. & Nelson, F. C., "The Influence of Dissipative Heating on the Lost Factor of Viscoelastically Damped Beam", *ASME Trans. Journal of Engineering for Industry*, 975–980 (1969).

Kubrusly, C. S. and H. Malebranche, "Sensors and Controllers Location in Distributed Systems—A Survey", Proc. of 3rd IFAC Symposium on Control of Distributed Parameter Systems, Toulouse, France, June 1982.

Lal, K. A., Asnani, N. T. & Nakra, B. C., "Damping Analysis of Partially Covered Sandwich Beams", *Journal of Sound and Vibration*, 123(2) 247–259 (1988).

Lee, C. K., *Piezo-electric Laminates for Torsional and Bending Modal Control: Theory and Experiments*. Ph.D. Thesis, Cornell University, 1987.

Lee, C. K., et al., "Piezo-electric Strain Rate Sensor and Actuator Design for Active Vibration Control", AIAA Paper No. 91-1064-CP, 1991.

Lin, D., Ni, R. G. and Adams, R. D., "Prediction and Measurements of the Vibrational Damping Parameters of Carbon and Glass Fibre-Reinforced Plastics Plates", J. of Composite Materials, Vol. 18, pp. 132–152, 1984.

Liao, D., Sung, C. and Thompson, B., "The Optimal Design of Symmetric Laminated Beams Considering Damping", J. of Composite Materials, Vol. 20, pp. 485–500, 1986.

Lu, Y. P. & Dougas, B. E., "On the Forced Vibrations of Three-Layer Damped Sandwich Beams", *Journal of Sound and Vibration*, 32(4), 513–516 (1974).

Lu, Y. P., Killian, J. W. & Everstine, G. C., "Vibrations of Three Layered Damped Sandwich Plate Composites", *Journal of Sound and Vibration*, 64(1), 63–71 (1979).

Lu, U. P. & Everstine, G. C., "More on Finite Element Modeling of Damped Composite Systems", *Journal of Sound and Vibration*, 69(2), 199–205 (1980).

LU, Y. P., Clemens, J. C. & Roscoe, A. J., "Vibrations of Composite Plate Structures Consisting of a Constrained-layer Damping Sandwich with Viscoelastic Core", 158(3), 552–558 (1992).

Mantena, P. R., "Optimal Constrained Viscoelastic Tape Lengths for Maximizing Damping in Laminated Composites", *AIAA Journal*, 29(10), 1678–1685 (1991).

Mead, D. J. & Markus, S., "The Forced Vibration of a Three-Layer, Damped Sandwich Beam with Arbitrary Boundary Conditions", *Journal of Sound and Vibration*, 10(1), 163–175 (1969).

Mead, D. J., "Loss Factors and Resonant Frequencies of Encastré Damped Sandwich Beams", *Journal of Sound and Vibration*, 12(1), 99–112 (1970).

Mead, D. J. & DiTaranto R. A., "Resonance Response Criteria of a Damped Three-Layered Beams", *ASME Trans. Journal of Engineering for Industry*, 174–180 (1972).

Meirovitch, L. and Baruh, H., "Optimal Control of Damped Flexible Gyroscopic Systems", Journal of Guidance, Control and Dynamics, Vol. 4, pp. 157–163, 1981.

Meirovitch, L. and Baruh, H., "The Implementation of Modal Filters for Control of Structures", *Journal of Guidance, Control and Dynamics*, Vol. 8, pp. 707–716, 1985.

Meirovitch, L. et al., "Control of Self-adjoint Distributed Parameter Systems", Journal of Guidance, Control and Dynamics, Vol. 5, pp. 59–66, 1982.

Mottram, J. T. and Selby, A. R., "Bending of Thin Laminated Plates", Computers & Structures, Vol. 25, No. 2, pp. 271–280, 1987.

Nakao, T., Tanaka, C., Takahashi, A. and Okano, T., "Experimental Study of Flexural Vibration of Orthotopic Viscoelastic Plates", *Journal of Sound and Vibration*, 116(3), 465–473 (1987).

Ni, R. and Adams, R., "The Damping and Dynamic Moduli of Symmetric Laminated Composite Beams", J. of Composite Materials, Vol. 18, pp. 104–121, 1984.

Nixon, M. W., "Extension-twist coupling of composite circular tubes with applications to tilt-rotor blade design", Proceedings of the AIAA 28th SDM Conference, Apr. 6–8, 1988, Monterey, Calif, pp. 295–303.

Nixon, M., "Improvement of Tilt Rotor Performance Through Passive Blade, Twist Control", NASA Technical Memorandum 100583, April 1988.

Parthasarathy, G & Reddy, C. V. R., "Partial Coverage of Rectangular Plates by Unconstrained Layer Damping Treatments", *Journal of Sound and Vibration*, 102(2), 203–216 (1985).

Parthasarathy, G., Ganesan, N. & Reddy, C. V. R., "Study of Unconstrained Layer Damping Treatments Applied to Rectangular Plates Having Central Cutouts", *Computers & Structures*, 23(3) 433–443, 1986.

Pearces, B. K. & Baumgarten, O. R., "The Damping Effects of Viscoelastic Materials Part 2—Transverse Vibrations of Plates with Viscoelastic Coatings", *ASME Trans Journal of Engineering for Industry*, 7, 651–655, 1971.

Penwalt Corp., "Kynar Piezo-Film", Technical Manual Number 10-M-11-83-M, King of Prussia, Pa., 1983.

Plump, J. M., J. E. Hubbard and F. Bailey, "Nonlinear Control of a Distributed System" Simulation and Experimental Results", Trans. ASME, J. of Dynamics Systems, Measurements and Control, Vol. 109, pp. 133–139, June 1987.

Plunket, R., "Vibration Control by Applied Damping Treatments", in *Shock and Vibration Handbook*, 2nd Edition, McGraw-Hill Book Co., N.Y., Ch. 37, 1976.

Plunkett, R. & Lee, C. T., "Length Optimization for Constrained Viscoelastic Layer amping", *The Journal of the Acoustical Society of America*, 48(1), 150–161 (1970).

Rao, D. K., "Static Response of Stiff-Cored Unsymmetric Sandwich Beams", *ASME Trans. Journal of Engineering for Industry*, 391–396 (1976).

Rao, D. K., "Vibration of Short Sandwich Beams", *Journal of Sound and Vibration*, 52(2), 253–263 (1977).

Rao, D. K., "Frequency and Loss Factors of Sandwich Beams under Various Boundary Conditions", *Journal of Mechanical Engineering Science*, 20(5), 271–282 (1978).

Rao, S. S., *The Finite Element Method in Engineering*, Pergamon Press, Oxford, 1985.

Rao, V. S., Sankar, B. V. & Sun, C. T., "Constrained Layer Damping of Initially Stressed Composite Beams Using Finite Elements", *Journal of Composite Material*, 26(12), 1752–1766 (1992).

Rao, Y. V. K. S. & Nakra, B. C., "Vibrations of Unsymmetrical Sandwich Beams and Plates with Viscoelastic Cores", *Journal of Sound and Vibration*, 34(3), 309–326, 1974.

Reddy, C. V. R. & Narayanan, S., "Response of Plates with Unconstrained Layer Damping Treatment to Random Acoustic Excitation. Part 1: Damping and Frequency Evaluations", *Journal of Sound and Vibration,* 69(1) 35–43 (1980).

Robbins, D. H. and J. N. Reddy, "Analysis of Piezoelectrically Actuated Beams Using Layer-Wise Displacement Theory", *J. of Computers & Structures,* Vol. 41, No. 2, pp. 265–279, 1991.

Rockey, K. C., et al., *The Finite Element Method,* Second Edition, Halsted Press, John Wiley & Sons, New York, 1983.

Ruzicka, J. E., "Damping Structural Resonances Using Viscoelastic Shear-Damping Mechanisms: Part I Design Configurations", *ASME Trans Journal of Engineering for Industry,* 403–413 (1961).

Ruzicka, J. E., "Damping Structural Resonances Using Viscoelastic Shear-Damping Mechanisms: Part II Experimental Results", *ASME Trans. Journal of Engineering for Industry,* 414–423 (1961).

Sim, S. & Kim, K. J., "A Method to Determine the Complex Modulus and Poisson's Ratio of Viscoelastic Materials for FEM Applications", *Journal of Sound and Vibration,* 141(1), 71–82 (1990).

Soni, M. L. & Bogner, F. K., "Finite Element Vibration Analysis of Damped Structures", *AIAA Journal,* 20(5), 700–707 (1982).

Srinivasan, A. V., et al., "Structural Dynamics of a Helicopter Rotor Blade System", J. American Helicopter Society, Vol. 35, No. 1, pp. 75–85, January 1990.

Sun, C. T., Sankar, B. V. & Rao, V. S., "Damping and Vibration Control of Unidirectional Composite Laminates Using Add-On Viscoelastic Materials", *Journal of Sound and Vibration,* 139(2), 277–287 (1990).

Torvik, P. J., "Damping of Layered Material", *AIAA paper* 89-1422-CP, 2246–2259, 1989.

Trompette, P., Boillot, D. & Ravanel, M. A., "The Effect of Boundary Conditions on the Vibration of a Viscoelastically Damped Cantilever Beam", *Journal of Sound and Vibration,* 60(3), 345–350 (1978).

Tzou, H. S. and C. I. Tseng, "Distributed Piezoelectric Sensor/Actuator Design for Dynamic Measurement/Control of Distributed Parameter Systems: A Piezoelectric Finite Element Approach", *J. of Sound & Vibration, Vol.* 138, No. 1, pp. 17–34, 1990.

Ungar, E. E. & Kerwin, E. M., Jr., "Loss Factors of Viscoelastic Systems in Terms of Energy Concepts", *The Journal of the Acoustical Society of America,* 34(7), 954–957 (1962).

Ungar, E. E., "Loss Factors of Viscoelastically Damped Beam Structures", *The Journal of the Acoustical Society of America,* 34(8) 1082–1089 (1962).

Vinson, J. R. and Sierakowski, R. L., *The Behavior of Structures Composed of Composite Materials,* 1987, Martinus Nijhoff Publishers, Dordrecht, the Netherlands.

Yah, M. J. & Dowell, E. H., "Governing Equations for Vibrating Constrained Layer Damping Sandwich Plates and Beams", *ASME Trans Journal Applied Mechanics* 104-10 (1972).

Yigit, A., Scott, A. and Ulsoy, A. G., "Flexural Motion of a Radially Rotating Beam Attached to a Rigid Body", J. of Sound and Vibration, Vol. 121, No. 2, pp. 201–210, 1988.

Yuan, F. G. & Miller, R. E., "A New Finite Element for Laminated Composite Beams", *Computers & Structures,* 31(5), 737–745 (1989), design, Jun. 17–20, 1985, Denver, Colo., AFWAL-TR-3094, pp. V(a) 1–15.

What is claimed is:

1. A device for actively controlling the damping of vibration or sound from a flexible structure, comprising:

a. a sensor layer in contact with the structure for detecting the vibration or sound of said structure, b. at least one vibration or sound damping layer, the vibration or sound damping layer in contact with the sensor layer and c. an active constraining layer, the active constraining layer in contact with said at least one vibration or sound damping layer for actively controlling the damping of vibration or sound in response to the detection from said sensor layer; wherein said active constraining layer is capable of being activated by a controller.

2. The device of claim 1 wherein the sensor layer and the active constraining layer each comprises piezo-electric material and the damping layer or layers comprises viscoelastic material.

3. The device of claim 2 wherein the sensor layer and the active constraining layer each comprises polyvinylidene fluoride.

4. A method for actively controlling the damping of vibration or sound from a flexible structure, comprising the steps of:

a. attaching the device of claim 1 to the structure and b. activating the device to actively control the damping of vibration or sound from the structure.

5. A method for actively controlling the damping of vibration or sound from a flexible structure, comprising the steps of:

a. attaching the device of claim 2 to the structure and b. activating the device to actively control the damping of vibration or sound from the structure.

6. A method for actively controlling the damping of vibration or sound from a flexible structure, comprising the steps of:

a. attaching the device of claim 3 to the structure and b. activating the device to actively control the damping of vibration or sound from the structure.

7. The device of claim 1, wherein first and second vibration or sound damping layers are provided, the first damping layer being sandwitched between the sensor layer and the active constraining layer, the second damping layer being in contact with the active constraining layer.

* * * * *

UNITED STATES PATENT AND TRADEMARK OFFICE
CERTIFICATE OF CORRECTION

PATENT NO. : 5,485,053
DATED : Jan. 16, 1996
INVENTOR(S) : Baz

It is certified that error appears in the above-identified patent and that said Letters Patent is hereby corrected as shown below:

On title page, insert the following:

[73]  Assignee: The Catholic University of America
                       Washington, D.C. 20064

Signed and Sealed this

Thirteenth Day of August, 1996

Attest:

BRUCE LEHMAN

Attesting Officer      Commissioner of Patents and Trademarks